United States Patent
Miya et al.

(10) Patent No.: US 7,942,976 B2
(45) Date of Patent: May 17, 2011

(54) SUBSTRATE PROCESSING APPARATUS AND SUBSTRATE PROCESSING METHOD

(75) Inventors: Katsuhiko Miya, Kyoto (JP); Akira Izumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 225 days.

(21) Appl. No.: 11/866,457

(22) Filed: Oct. 3, 2007

(65) Prior Publication Data

US 2008/0121251 A1    May 29, 2008

(30) Foreign Application Priority Data

Nov. 24, 2006   (JP) ................................ 2006-316541

(51) Int. Cl.
*H01L 21/304*   (2006.01)
*B08B 3/00*   (2006.01)

(52) U.S. Cl. ................ 134/4; 134/26; 134/30; 134/31; 134/33; 134/902

(58) Field of Classification Search .............. 134/102.1, 134/102.2, 105, 902, 1.2, 1.3, 4, 26, 30, 31, 134/33

See application file for complete search history.

(56) References Cited

U.S. PATENT DOCUMENTS

| | | | |
|---|---|---|---|
| 4,817,652 A | 4/1989 | Liu et al. | |
| 4,962,776 A | 10/1990 | Liu et al. | |
| 5,857,474 A | 1/1999 | Sakai et al. | |
| 6,783,599 B2 | 8/2004 | Gale et al. | |
| 7,604,013 B2 | 10/2009 | Nakamura et al. | |
| 2004/0261817 A1* | 12/2004 | Araki et al. ........................ 134/2 |
| 2006/0048792 A1 | 3/2006 | Nakamura et al. | |
| 2006/0266382 A1* | 11/2006 | Matsubara ....................... 134/33 |
| 2009/0272407 A1 | 11/2009 | Nakamura et al. | |

FOREIGN PATENT DOCUMENTS

EP   0 423 761   4/1991

(Continued)

OTHER PUBLICATIONS

Notice of Allowance issued in corresponding Korean Patent Application No. 2007-0102891 mailed Apr. 29, 2009 (Korean language).

(Continued)

*Primary Examiner* — Joseph L Perrin
*Assistant Examiner* — Benjamin Osterhout
(74) *Attorney, Agent, or Firm* — Ostrolenk Faber LLP

(57) ABSTRACT

A rinsing liquid supplier includes a temperature adjuster. The temperature adjuster cools DIW to a temperature lower than room temperature. This temperature adjuster cools down DIW to a temperature not more than 10 degrees centigrade for instance, and cooling down to an even lower temperature of 5 degrees centigrade or below is more preferable. Meanwhile, the temperature adjuster maintains DIW at not less than 0 degrees centigrade, which prevents freezing of the DIW. The cooled DIW supplied to a rinsing liquid pipe is discharged from the rinsing liquid discharge nozzle toward the top surface of the substrate, to thereby form a liquid film. Further, the cooled DIW is discharged toward the rear surface of the substrate from the liquid discharge nozzle via the liquid supply pipe, to thereby form the liquid film on the rear surface. Since the liquid films are already cooled, they are frozen in a short time when the cooling gas is discharged toward the top surface and the rear surface of the substrate.

4 Claims, 15 Drawing Sheets

FOREIGN PATENT DOCUMENTS

| | | |
|---|---|---|
| JP | 62-169420 | 7/1987 |
| JP | 3-145130 | 6/1991 |
| JP | 3-503975 | 9/1991 |
| JP | 3-261142 | 11/1991 |
| JP | 7-151434 | 6/1995 |
| JP | 07-201795 | 8/1995 |
| JP | 7-240356 | 9/1995 |
| JP | 09-186123 | 7/1997 |
| JP | 11-31673 | 2/1999 |
| JP | 11-274046 | 10/1999 |
| JP | 3343013 | 11/2002 |
| JP | 2006-80315 | 3/2006 |

OTHER PUBLICATIONS

Office Action issued Jan. 12, 2010 in related U.S. Appl. No. 11/928,694, which includes, at p. 5, a nonstatutory obviousness-type double patenting rejection over certain claims of the present application.

Office Action issued Aug. 2, 2010 in related U.S. Appl. No. 11/837,575 of Katsuhiko Miya et al., filed Aug. 13, 2007, which includes, at pp. 2-4, a nonstatutory obviousness-type double patenting rejection over certain claims of the present application.

Japanese Office Action received Nov. 24, 2010 in connection with corresponding Japanese Patent Application No. 2006-316541.

* cited by examiner

F I G. 3
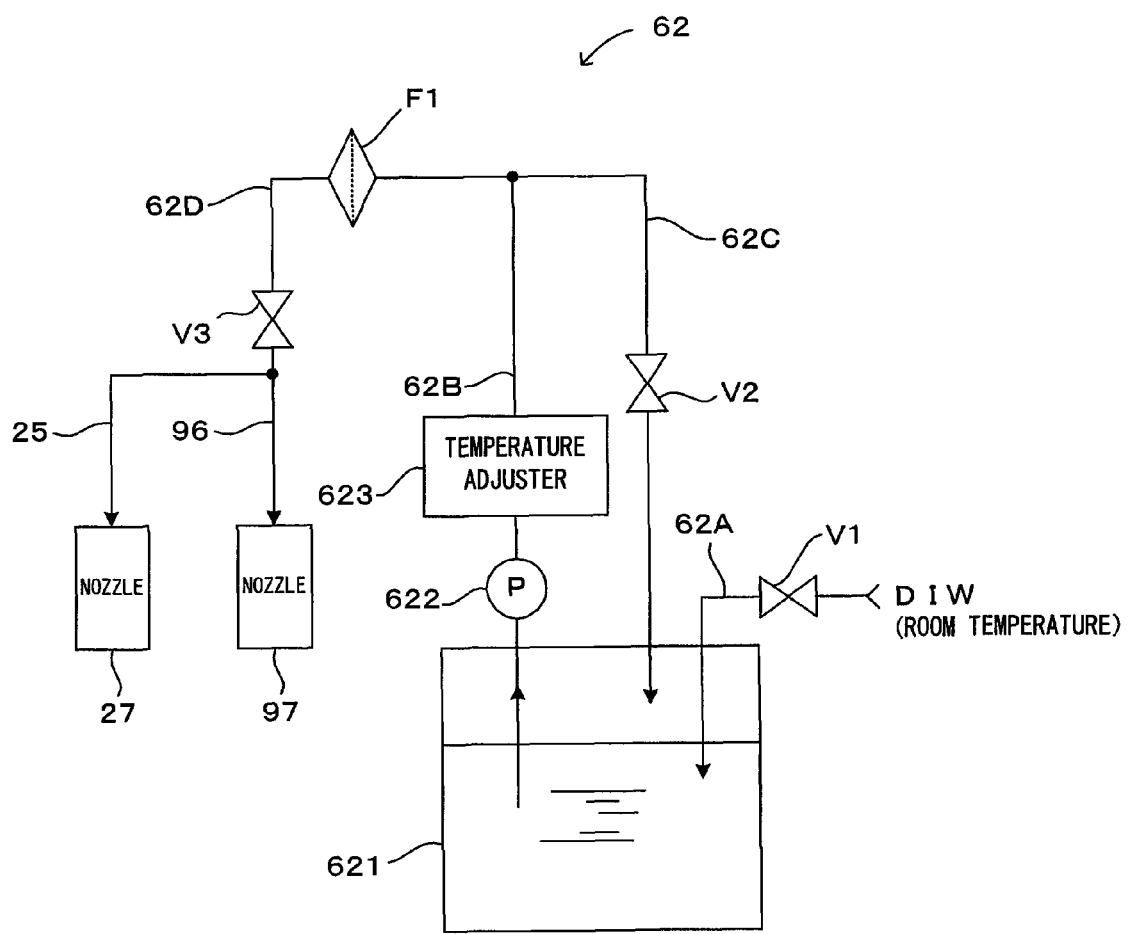

LIQUID FILM FORMATION

LIQUID FILM FREEZING

FROZEN FILM REMOVAL

F I G. 1 3
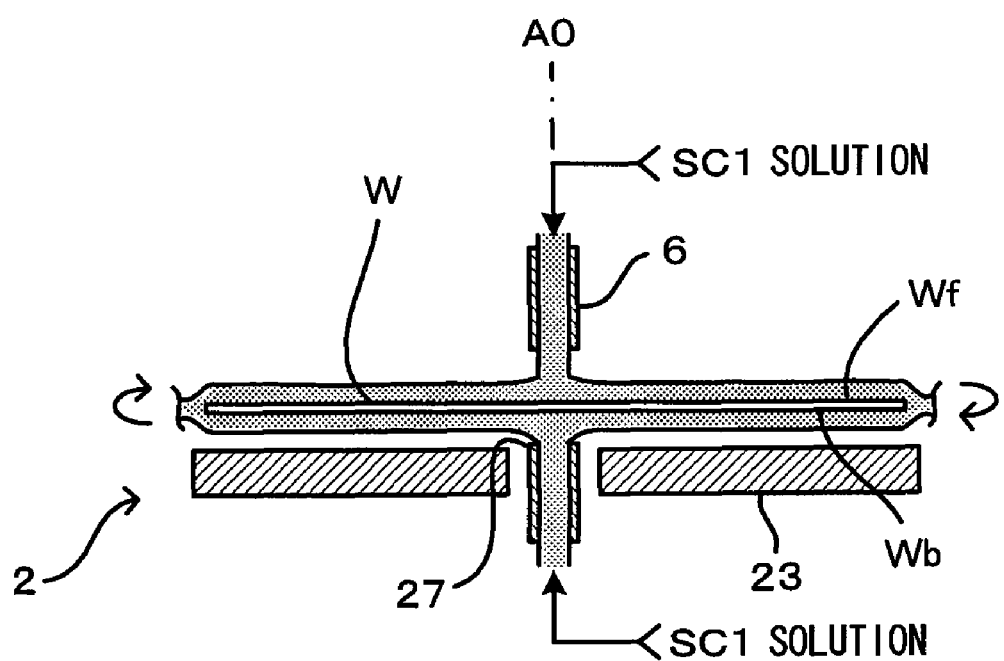

F I G. 1 5
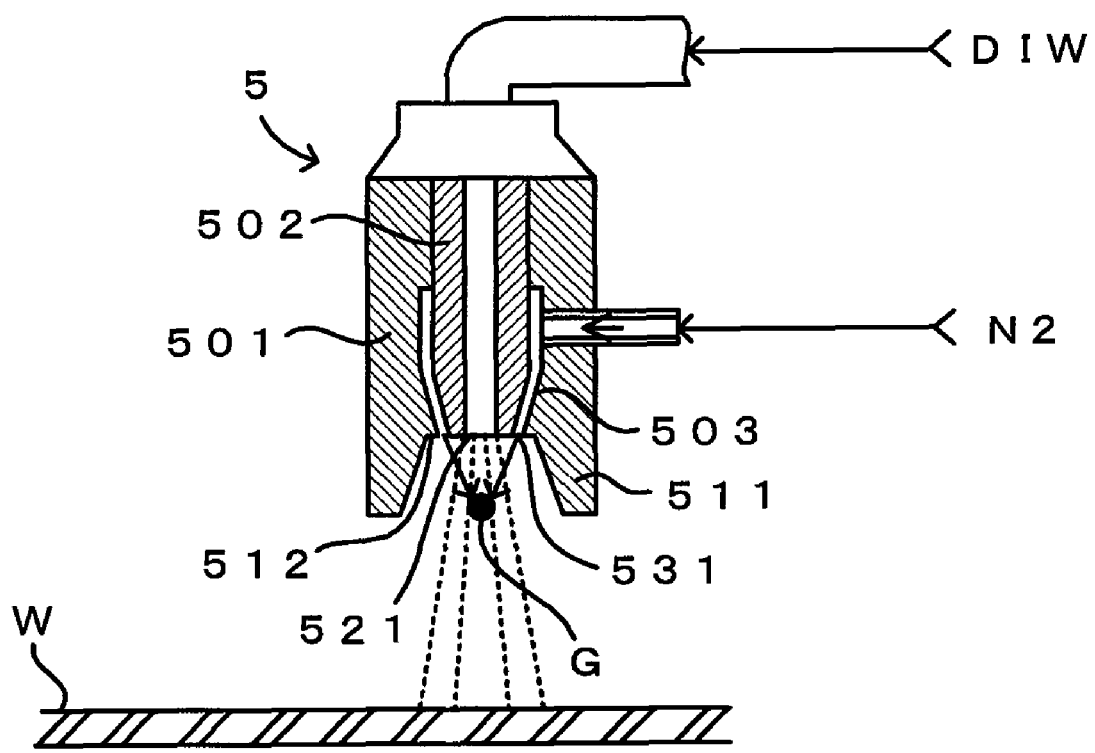

SUBSTRATE PROCESSING APPARATUS AND SUBSTRATE PROCESSING METHOD

CROSS REFERENCE TO RELATED APPLICATION

The disclosure of Japanese Patent Application No. 2006-316541 filed Nov. 24, 2006 including specification, drawings and claims is incorporated herein by reference in its entirety.

BACKGROUND OF THE INVENTION

1. Field of the Invention

The present invention relates to a substrate processing apparatus and a substrate processing method which freeze a liquid film formed on a surface of a substrate, the substrate including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

2. Description of the Related Art

Conventionally used is a technique of freezing a liquid film as it is maintained adhering to a substrate surface by cooling a substrate as one of a substrate processing. Particularly this freezing technique is used as part of a substrate cleaning processing. That is, as devices typified by semiconductors have finer patterns, more advanced functions and higher precision, it becomes increasingly difficult to remove fine contaminants such as particles adhering to the substrate surface without destroying patterns formed on the substrate surface. And so, particles adhering to the substrate surface are removed in the following manner utilizing the freezing technique described above.

First, a liquid film is formed on a substrate surface by supplying liquid to the substrate surface. Subsequently, the liquid film is frozen by cooling the substrate. Thus, a frozen film is formed on the substrate surface to which particles adhere. Finally, the frozen film is removed from the substrate surface, whereby the particles are removed from the substrate surface together with the frozen film. In the apparatus described in JP-A-11-31673 for example, purified water is supplied to the substrate surface to form a liquid film and the liquid film is frozen.

SUMMARY OF THE INVENTION

By the way, the apparatus described in JP-A-11-31673 requires a comparatively long time period to freeze the liquid film. Hence, there arises a problem that the number of substrates processible per unit of time is reduced and that the throughput decreases.

The present invention is made in light of the above problem, and an object of the invention is to provide a substrate processing apparatus and a substrate processing method which can freeze a liquid film on a substrate in a short time.

According to a first aspect of the present invention, there is provided a substrate processing apparatus, comprising: a liquid film forming unit which supplies a cooled liquid to a substrate to form a liquid film on the substrate; and a freezing unit which freezes the liquid film on the substrate.

According to a second aspect of the present invention, there is provided a substrate processing method, comprising: a liquid film forming step of supplying a cooled liquid to a substrate to form a liquid film on the substrate; and a freezing step of freezing the liquid film on the substrate.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 3 is a view showing a frame format of a structure of the rinsing liquid supplier.

FIG. 13 is a diagram showing a frozen film removal processing in the apparatus shown in FIG. 12.

FIG. 15 is a diagram showing a structure of a two-fluid nozzle.

DETAILED DESCRIPTION OF THE PREFERRED EMBODIMENTS

First Embodiment

Figure 1:
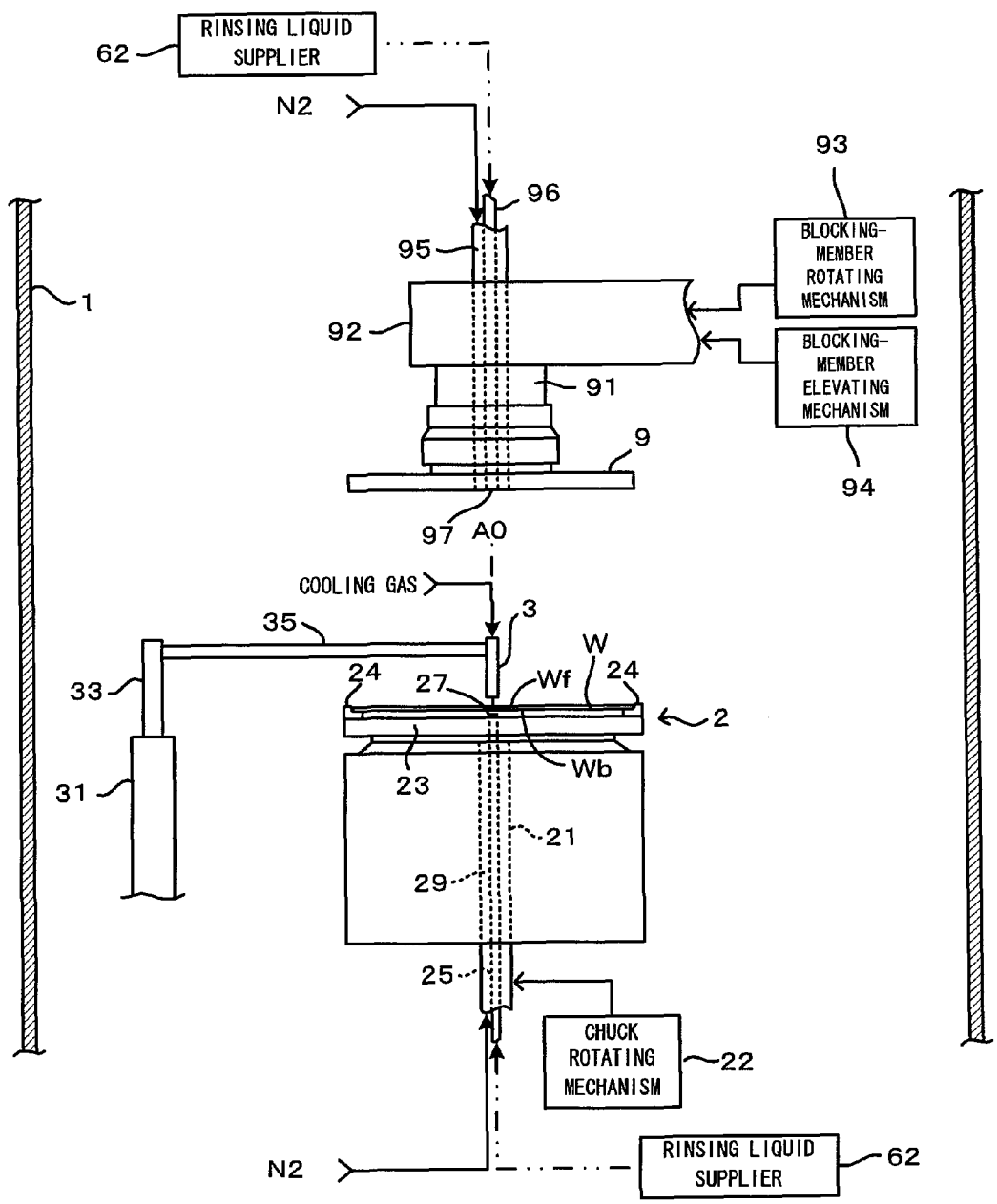
FIG. 1 is a diagram showing a first embodiment of a substrate processing apparatus according to the invention.
Figure 2:
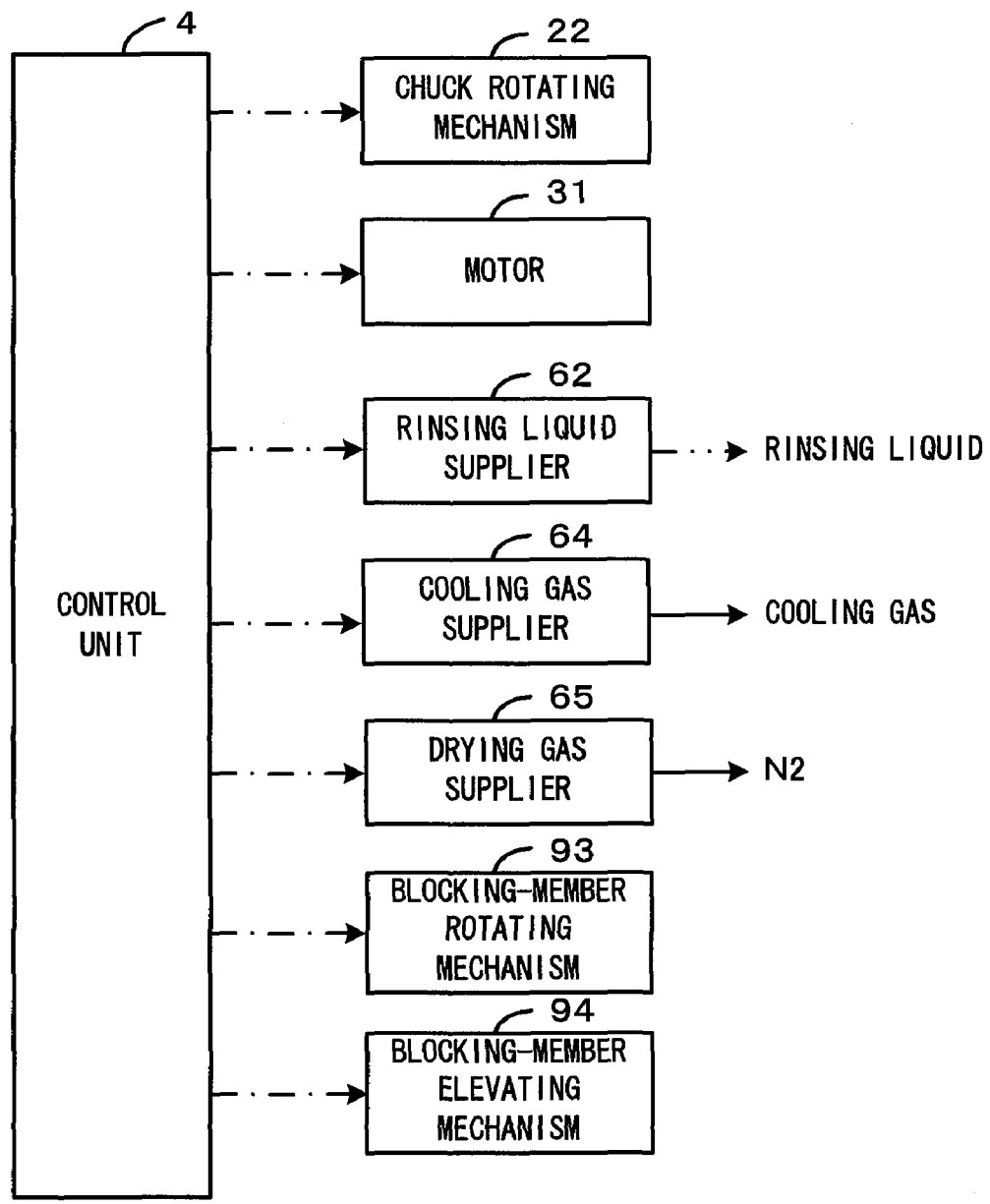
FIG. 2 is a block diagram showing a control construction of the substrate processing apparatus shown in FIG. 1.

FIG. 1 is a diagram showing a first embodiment of a substrate processing apparatus according to the invention. FIG. 2 is a block diagram showing a control construction of the substrate processing apparatus shown in FIG. 1. This substrate processing apparatus is a single wafer type substrate processing apparatus that is used for the cleaning processing for the purpose of removing contaminants such as particles adhering to a top surface Wf and a rear surface Wb of a substrate W such as semiconductor wafer. More specifically, this substrate processing apparatus is an apparatus which forms a liquid film on the top surface Wf and the rear surface Wb of the substrate W, forms a frozen film by freezing the respective liquid films, and removes the frozen films from the top surface Wf and the rear surface Wb of the substrate W, whereby a cleaning processing is performed to the substrate W.

This substrate processing apparatus includes a processing chamber 1 which has a processing space inside in which a cleaning processing is performed to the substrate W, and a control unit 4 which controls the entire apparatus. In the processing chamber 1, a spin chuck 2, a cooling gas discharge nozzle 3, and a blocking member 9 are provided. The spin chuck 2 holds the substrate W in an approximately horizontally such that the top surface Wf of the substrate W is directed toward above and rotates the substrate W. The cooling gas discharge nozzle 3 discharges cooling gas for freezing a liquid film toward the top surface Wf of the substrate W held by the spin chuck 2. The blocking member 9 is disposed facing the top surface Wf of the substrate W held by the spin chuck 2.

A disk-shaped spin base 23 is fixed by a fastening component such as a screw to a top end portion of a central shaft 21 of the spin chuck 2. The central shaft 21 is linked to a rotation shaft of a chuck rotating mechanism 22 which contains a motor. The spin base 23 fixed to the central shaft 21 rotates about a rotation center A0 when the chuck rotating mechanism 22 is driven in response to an operation command received from the control unit 4.

Plural chuck pins 24 for holding the substrate W at the rim thereof are disposed upright in the vicinity of the rim of the spin base 23. There may be three or more chuck pins 24 to securely hold the disk-shaped substrate W, and the chuck pins 24 are arranged at equal angular intervals along the rim of the spin base 23. Each of the respective chuck pins 24 comprises a substrate support part which supports the substrate W at the rim thereof from below and a substrate holding part which presses the substrate W at the outer peripheral edge surface thereof to hold the substrate W. Each chuck pin 24 is structured so as to be capable of switching between a pressing state that the substrate holding part presses the substrate W at the outer peripheral edge surface thereof and a released state that the substrate holding part stays away from the outer peripheral edge surface of the substrate W.

The respective chuck pins 24 are in the released state while the substrate W is being transferred to the spin base 23 but in the pressing state for cleaning of the substrate W. When in the pressing state, the respective chuck pins 24 hold the substrate W at the rim thereof and keep the substrate approximately horizontally at a predetermined distance from the spin base 23. The substrate W is held with its top surface Wf directed toward above and its rear surface Wb toward below. Meanwhile, in this embodiment, fine patterns are formed on the top surface Wf of the substrate W, which means that the top surface Wf is a pattern-formed surface.

The blocking member 9 is in a form of a disk-shape which has an opening at its center. The under surface of the blocking member 9 is a substrate-facing surface which faces the top surface Wf of the substrate W approximately parallel, and the size of this surface is equal to or greater than the diameter of the substrate W. The blocking member 9 is attached approximately horizontally to the lower end of a support shaft 91 which is shaped approximately like a circular cylinder. An arm 92 extending in the horizontal direction holds the support shaft 91 so that the support shaft 91 can rotate about a vertical axis which penetrates the center of the substrate W. Further, a blocking-member rotating mechanism 93 and a blocking-member elevating mechanism 94 are connected to the arm 92.

The blocking-member rotating mechanism 93 rotates the support shaft 91 in response to an operation command from the control unit 4 about the vertical axis which penetrates the center of the substrate W. Further, the control unit 4 controls an operation of the blocking-member rotating mechanism 93 to rotate the blocking member 9 at about the same rotation speed in the same direction as the substrate W in accordance with rotation of the substrate W which is held by the spin chuck 2.

The blocking-member elevating mechanism 94 moves the blocking member 9 toward the spin base 23, and conversely, away therefrom in accordance with an operation command from the control unit 4. Specifically, the control unit 4 controls an operation of the blocking-member elevating mechanism 94 to move the blocking member 9 upward to a separated position (position shown in FIG. 1) above the spin chuck 2 upon loading and unloading the substrate W into and from the substrate processing apparatus, whereas to move the blocking member 9 downward to a specified facing position set very close to the top surface Wf of the substrate W held by the spin chuck 2 upon performing a predetermined processing to the substrate W.

The support shaft 91 is formed hollow and accepts penetration by a gas supply pipe 95 which extends to the opening of the blocking member 9. The gas supply pipe 95 is connected with the drying gas supplier 65. The drying gas supplier 65 supplies nitrogen gas via the gas supply pipe 95 to a space which is formed between the blocking member 9 and the top surface Wf of the substrate W, during drying of the substrate W after cleaning. Meanwhile, although nitrogen gas is supplied from the drying gas supplier 65 as a drying gas in this embodiment, air or another inert gas may be supplied.

A rinsing liquid supply pipe 96 is inserted inside the gas supply pipe 95. A bottom end portion of the rinsing liquid supply pipe 96 extends to the opening of the blocking member 9, and a rinsing liquid discharging nozzle 97 is disposed at a tip end of the rinsing liquid supply pipe 96. Whereas, a top end portion of the rinsing liquid supply pipe 96 is connected with a rinsing liquid supplier 62. The rinsing liquid supplier 62 supplies a rinsing liquid. As the rinsing liquid, deionized water (hereinafter called "DIW") is used for instance in this embodiment.

FIG. 3 is a view showing a frame format of a structure of the rinsing liquid supplier. A tank 621 stores DIW and is connected with a DIW supply source (not shown) already installed in a plant for instance via a supply pipe 62A in which a valve V1 is disposed. A supply pipe 62B is for supplying DIW to outside from the tank 621, and a pump 622 and a temperature adjuster 623 are disposed in the supply pipe 62B. The lower end of the supply pipe 62B is disposed reaching DIW stored in the tank 621, while the upper end of the supply pipe 62B branches into supply pipes 62C and 62D. A valve V2 is disposed in the supply pipe 62C, and the lower end of the supply pipe 62C is disposed sticking into inside the tank 621. The supply pipe 62D is connected with the above rinsing liquid supply pipe 96 and a liquid supply pipe 25 described later, and a filter F1 and a valve V3 are disposed in the supply pipe 62D. The temperature adjuster 623 cools down DIW to a temperature lower than room temperature. The temperature adjuster 623 cools down DIW to a temperature not more than 10 degrees centigrade for instance in this embodiment, and cooling down to an even lower temperature of 5 degrees centigrade or below is more preferable. Meanwhile, the temperature adjuster 623 maintains DIW at not less than 0 degrees centigrade, which prevents the DIW from freezing.

In the structure like this, DIW at room temperature is supplied to the tank 621 from the DIW supply source when the valve V1 is opened from the state that the valves V1, V2 and V3 are closed. Meanwhile, when the valve V2 is opened with the valve V3 closed and the pump 622 and the temperature adjuster 623 operate, the temperature adjuster 623 cools down DIW while the DIW circulates through the tank 621 and the supply pipes 62B and 62C. When the valve V2 is closed and the valve V3 is opened, thus cooled DIW is supplied toward the rinsing liquid supply pipe 96 and the liquid supply pipe 25 after filtered by the filter F1. The cooled DIW supplied to the rinsing liquid supply pipe 96 is discharged toward the top surface Wf of the substrate W from the rinsing liquid discharging nozzle 97, whereby a liquid film 11$f$ (FIG. 5) is formed on the top surface Wf.

Description is to be continued by referring back to FIG. 1. The central shaft 21 of the spin chuck 2 is formed by a hollow shaft having a cylindrical cavity. A cylindrical liquid supply pipe 25 for supplying a liquid to the rear surface Wb of the substrate W is inserted in the central shaft 21. The liquid supply pipe 25 extends to a position close to the rear surface Wb which is in the under surface side of the substrate W which is held by the spin chuck 2, and a tip end of the liquid supply pipe 25 mounts a liquid discharging nozzle 27 which discharges the liquid toward a central area in the bottom surface of the substrate W. The liquid supply pipe 25 is connected to the rinsing liquid supplier 62. When cooled DIW is supplied from the rinsing liquid supplier 62, the cooled DIW is discharged from the liquid discharging nozzle 27 via the liquid supply pipe 25 toward the rear surface Wb of the substrate W whereby a liquid film 11$b$ (FIG. 5) is formed on the rear surface Wb. Thus, in this embodiment, the rinsing liquid supplier 62, the rinsing liquid supply pipe 96, the rinsing liquid discharging nozzle 97, the liquid supply pipe 25 and the liquid discharging nozzle 27 correspond to the "liquid film forming unit" of the invention.

A clearance between the inner wall surface of the central shaft 21 and the outer wall surface of the liquid supply pipe 25 forms a gas supply passage 29 which is in a form of a ring in horizontal section. This gas supply passage 29 is connected to the drying gas supplier 65, so that nitrogen gas is supplied from the drying gas supplier 65 via the gas supply passage 29 to a space formed between the spin base 23 and the rear surface Wb of the substrate W.

A motor 31 is disposed at a place outward from the spin chuck 2 in a circumferential direction. A rotary shaft 33 is connected to the motor 31, an arm 35 extending horizontally is connected to the rotary shaft 33, and the cooling gas discharge nozzle 3 is attached to the end of the arm 35. When the motor 31 is driven in accordance with an operation command from the control unit 4, the arm 35 swings around the rotary shaft 33.

Figure 4A:
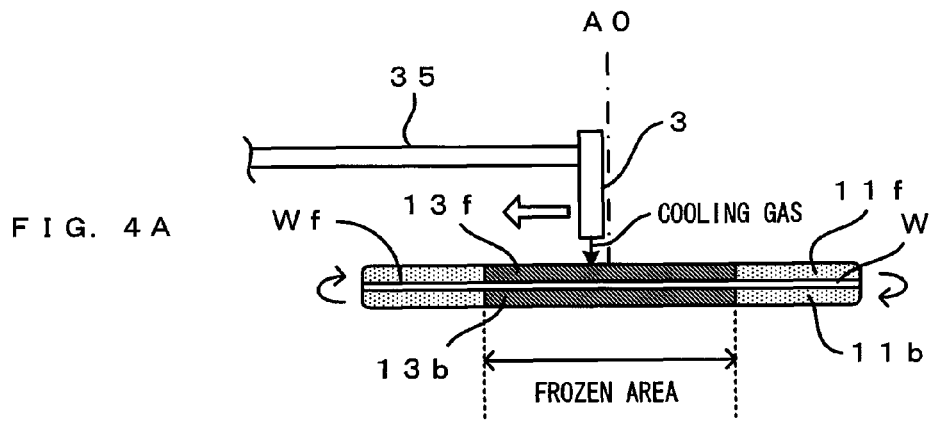
FIGS. 4A and 4B are diagrams showing a movement of the cooling gas discharge nozzle.
Figure 4B:
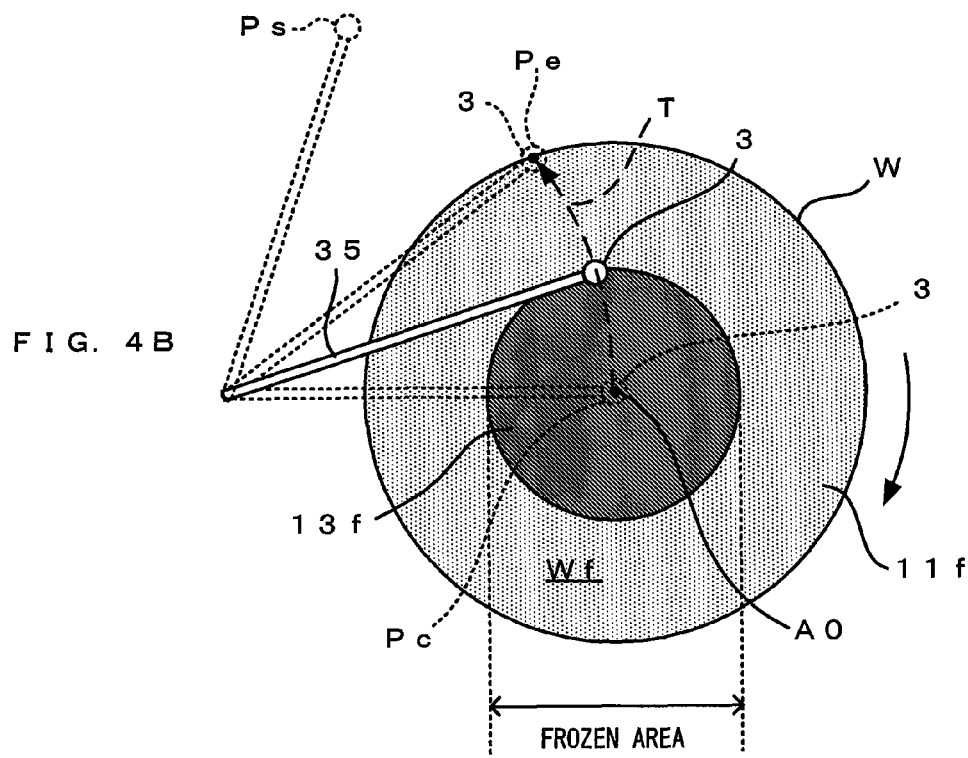

FIGS. 4A and 4B are diagrams showing a movement of the cooling gas discharge nozzle. FIG. 4A is a side view of the cooling gas discharge nozzle and FIG. 4B is a plan view thereof. When the motor 31 is driven to swing the arm 35 based on the operation command from the control unit 4, the cooling gas discharge nozzle 3 moves along a moving trajectory T while facing the top surface Wf of the substrate W as shown in FIG. 4B. The moving trajectory T is a trajectory from a rotational center position Pc toward an edge position Pe. At this stage, the rotational center position Pc is located over the substrate W and above the rotation center A0 of the substrate W, and the edge position Pe is located above the outercircumferential edge of the substrate W. That is, the motor 31 relatively moves the cooling gas discharge nozzle 3 relative to the substrate W and parallel to the top surface Wf of the substrate W. Further, the cooling gas discharge nozzle 3 is movable to a standby position Ps which is located on an extended line of the moving trajectory T and away from the opposed position to the substrate W.

The cooling gas discharge nozzle 3 is connected to a cooling gas supplier 64. The cooling gas supplier 64 supplies cooling gas to the cooling gas discharge nozzle 3 in accordance with an operation command from the control unit 4. When the cooling gas discharge nozzle 3 is positioned facing the top surface Wf of the substrate W, and the cooling gas is supplied to the cooling gas discharge nozzle 3 from the cooling gas supplier 64, the cooling gas is discharged from the cooling gas discharge nozzle 3 toward the top surface Wf of the substrate W locally. And, when the motor 31 moves the cooling gas discharge nozzle 3 along the moving trajectory T while the substrate W is rotated by the spin chuck 2 in accordance with a operation command from the control unit 4, in a state that the cooling gas is discharged from the cooling gas discharge nozzle 3, the cooling gas is supplied to the entire top surface Wf of the substrate W.

Therefore, the entire liquid film 11$f$ formed on the top surface Wf of the substrate W by the discharge of DIW from the rinsing liquid discharging nozzle 97 is frozen to form a frozen film 13$f$ on the entire top surface Wf of the substrate W. At this stage, the cold energy of the cooling gas supplied toward the top surface Wf of the substrate W is transmitted to a liquid film 11$b$ of the rear surface Wb via the substrate W. In the case where the substrate W is made of silicon particularly, since silicon has a relatively large coefficient of thermal conductivity, the cold energy is efficiently transmitted to the liquid film 11$b$ of the rear surface Wb via the substrate W. This expands an area where the liquid film 11$b$ has been frozen of the rear surface Wb of the substrate W, at the same time as the frozen area on the top surface Wf of the substrate W.

The height of the cooling gas discharge nozzle 3 from the top surface Wf of the substrate W is different depending upon the supplying amount of the cooling gas, but may be set not more than 50 mm for instance and preferably about several mm. Such height of the cooling gas discharge nozzle 3 from the top surface Wf of the substrate W and the supplying amount of the cooling gas is determined experimentally from (1) a viewpoint of giving cold energy the cooling gas has to the liquid film 11$f$ efficiently, and (2) a viewpoint of freezing the liquid film 11$f$ stably without distorting the surface of the liquid film 11$f$ by the cooling gas.

A temperature of the cooling gas is below the freezing point of the liquid which composes the liquid film 11$f$ formed on the top surface Wf of the substrate W, that is, below the freezing point of DIW in this embodiment. The cooling gas is produced by flowing nitrogen gas in a pipe which is disposed in a liquid nitrogen stored in a tank, for example, and is cooled at −100 degrees centigrade for instance. Meanwhile, oxygen gas, clean air, and the like may be used instead of nitrogen gas. Since such cooling gas is used, it is easy to eliminate contaminants contained in the cooling gas by a filter and the like before supplying the gas to the top surface Wf of the substrate W, which makes it possible to prevent from contaminating the top surface Wf of the substrate W in freezing the liquid film 11$f$. Thus, in this embodiment, the cooling gas discharge nozzle 3 corresponds to the "cooling gas discharger" of the invention, and the motor 31 corresponds to the "relative moving mechanism" of the invention.

Figure 5A:
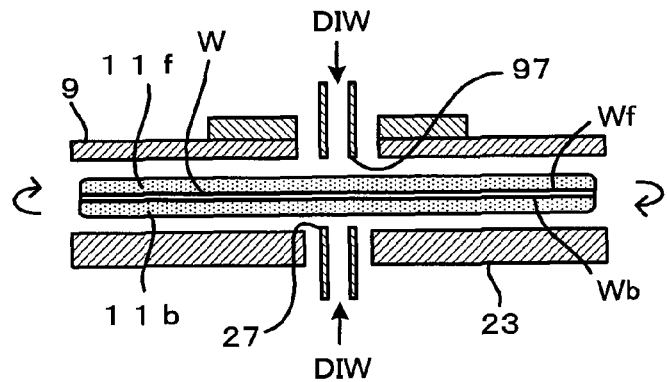
FIGS. 5A, 5B and 5C are diagrams showing a processing to the top surface Wf and the rear surface Wb of the substrate W.
Figure 5B:
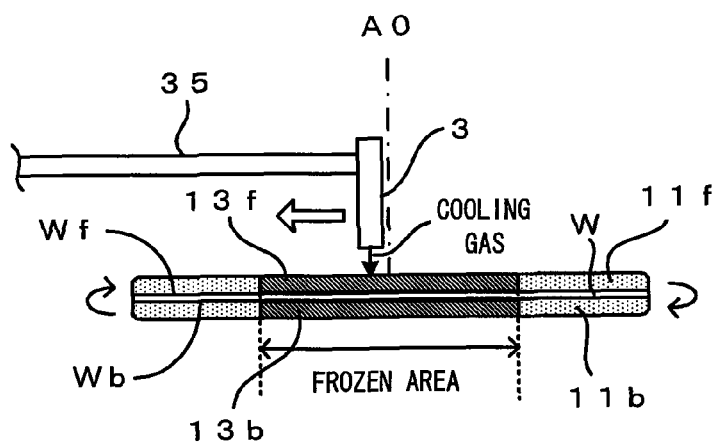
Figure 5C:
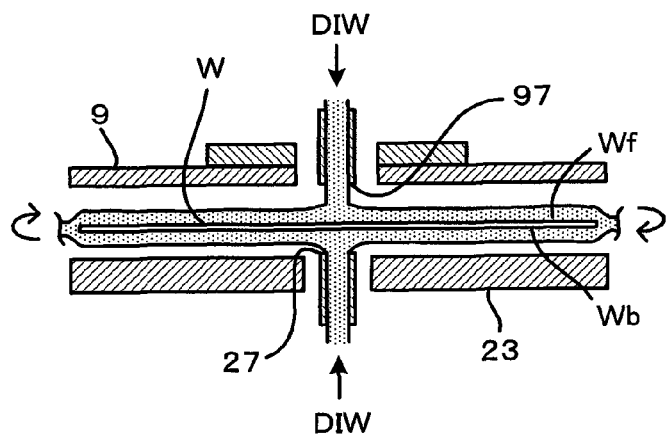
Figure 6:
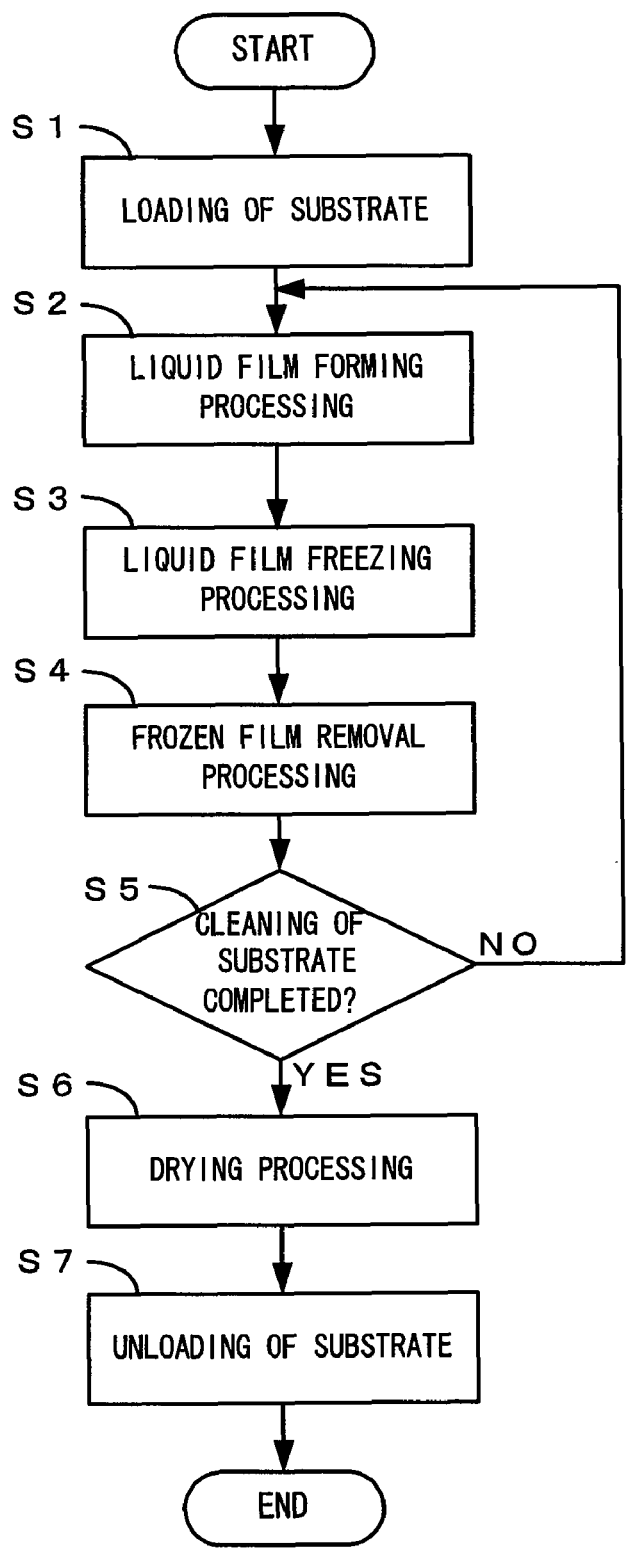
FIG. 6 is a flow chart of the operation in the substrate processing apparatus shown in FIG. 1.

The cleaning operation in the substrate processing apparatus having the structure above will now be described with reference to FIGS. 5A, 5B, 5C and 6. FIGS. 5A, 5B and 5C are diagrams showing a processing to the top surface Wf and the rear surface Wb of the substrate W. FIG. 5A shows a liquid film forming processing, FIG. 5B shows a liquid film freezing processing, and FIG. 5C shows a frozen film removal processing. Further, FIG. 6 is a flow chart of the operation in the substrate processing apparatus shown in FIG. 1. In this apparatus, upon loading of the substrate W into inside the apparatus, the control unit 4 controls the respective sections of the apparatus and a series of cleaning processing, that is, liquid film forming processing, liquid film freezing processing, and frozen film removal processing is performed upon the substrate W. First, the substrate W is loaded into inside the processing chamber 1 with the top surface Wf of the substrate W directed toward above, and held by the spin chuck 2 (Step S1). Meanwhile, the blocking member 9 is located at the separated position, which obviates interference with the substrate W.

As the spin chuck 2 holds an unprocessed substrate W, the blocking member 9 descends to the opposed position and becomes positioned close to the top surface Wf of the substrate W. The top surface Wf of the substrate W is therefore covered as it is located in the vicinity of the substrate-facing surface of the blocking member 9, and is blocked from the surrounding atmosphere around the substrate W. The control unit 4 then activates the chuck rotating mechanism 22 to rotate the spin chuck 2, and activates the rinsing liquid supplier 62 to discharge cooled DIW from the rinsing liquid discharging nozzle 97 and the liquid discharging nozzle 27 to supply the DIW to the top surface Wf and the rear surface Wb of the substrate W, respectively. Centrifugal force which develops as the substrate W rotates acts upon the DIW supplied to the top surface Wf and the rear surface Wb of the substrate W, and the DIW spreads uniformly outward in the radial direction of the substrate W and is partially shaken off from the substrate. This controls the thickness of the liquid film uniform all across the entire top surface Wf and the rear surface Wb of the substrate W, and forms the liquid films 11*f* and 11*b* which have a predetermined thickness all over the top surface Wf and the rear surface Wb of the substrate W, respectively as shown in FIG. 5A (Step S2). At this stage, the control unit 4 adjusts the number of rotation of the spin chuck 2, whereby the liquid films 11*f* and 11*b* which have desired thickness can be formed.

Meanwhile, in the liquid film forming processing, to shake off a part of the DIW supplied to the top surface Wf and the rear surface Wb of the substrate W as described above is not an essential requirement. For instance, in a condition that the substrate W has stopped rotating or is rotating relatively slowly, a liquid film may be formed on the top surface Wf and the rear surface Wb of the substrate W without shaking the DIW off from the substrate W.

When the liquid film forming processing is thus finished, the control unit 4 positions the blocking member 9 at the separated position and moves the cooling gas discharge nozzle 3 to the rotational center position Pc from the stand-by position Ps. While discharging the cooling gas toward the top surface Wf of the rotating substrate W, the cooling gas discharge nozzle 3 then moves gradually toward the edge position Pe of the substrate W. As a result, as shown in FIG. 5B, of the surface region of the top surface Wf of the substrate W, an area where the liquid film 11*f* has been frozen expands toward the periphery edge from the center of the top surface Wf of the substrate W, and of the rear surface Wb, an area where the liquid film 11*b* has been frozen expands toward the periphery edge from the center of the rear surface Wb of the substrate W, whereby the frozen films 13*f* and 13*b* are formed all over the top surface Wf and the rear surface Wb of the substrate W (Step S3). At this stage, since the DIW which composes the liquid films 11*f* and 11*b* is cooled below room temperature by the temperature adjuster 623, it is possible to form the frozen films 13*f* and 13*b* in a short time.

Meanwhile, it is possible to suppress an uneven distribution of the liquid film thickness and accordingly form the frozen films 13*f* and 13*b* all over the top surface Wf and the rear surface Wb of the substrate W by rotating the substrate W while the cooling gas discharge nozzle 3 is moved. However, if the substrate W rotates at an excessively high speed, air flows developed by the rotations of the substrate W may diffuse the cooling gas which is discharged from the cooling gas discharge nozzle 3 and the efficiency of freezing the liquid film may worsen. Therefore, the rotation speed of the substrate W in performing the liquid film freezing processing is set to 1 through 300 rpm for example in this embodiment. Further, it is more preferable that the rotation speed of the substrate W is determined considering the traveling speed of the cooling gas discharge nozzle 3, the temperature and the flow rate of the discharged gas and the thickness of the liquid film as well.

When the liquid film freezing processing is executed in this way, the liquid entering between the top surface Wf of the substrate W and the particles is frozen, whereby the volume is expanded. For example, when purified water of 0 degrees centigrade becomes ice of 0 degrees centigrade, the volume thereof increases by about 1.1 times. The pressure generated by the volume expansion acts on the particles, whereby the particles move away extremely short distances from the top surface Wf of the substrate W. This reduces the adherence between the top surface Wf of the substrate W and the particles and further separates the particles from the top surface Wf of the substrate W. When this occurs, even though there are fine patterns formed on the top surface Wf of the substrate W, since the pressure upon the patterns owing to the cubical expansion is equal in all directions, the force applied upon the patterns gets offset. Hence, it is possible to preferably remove the particles off from the top surface Wf of the substrate W, without damaging the substrate W such as peeling the patterns off or destroying the patterns.

Further, in this embodiment, since the liquid film 11*b* is also formed on the rear surface Wb of the substrate W, and the liquid film 11*b* is frozen to form the frozen film 13*b*, it is possible to weaken the adherence between particles and the substrate W not only at the top surface Wf of the substrate W but at the rear surface Wb of the substrate W. Hence, it is possible to preferably remove particles from the rear surface Wb of the substrate W.

When the freezing of the liquid film is completed, the control unit 4 moves the cooling gas discharge nozzle 3 to the stand-by position Ps and positions the blocking member 9 at the opposed position. The rinsing liquid discharging nozzle 97 and the liquid discharging nozzle 27 supply the DIW respectively to the top surface Wf and the rear surface Wb of the substrate W before the frozen films 13*f* and 13*b* have been melted. At this time, the control unit 4 stops the operation of the temperature adjuster 623, whereby the DIW of room temperature is supplied to the substrate W. This causes the frozen films on the top surface Wf and the rear surface Wb of the substrate W to be melted respectively as shown in FIG. 5C. Further, the centrifugal force which develops as the substrate W rotates acts upon the frozen films 13*f* and 13*b*, and upon the DIW supplied to the top surface Wf and the rear surface Wb of the substrate W. In consequence, the frozen films 13*f* and 13*b* containing the particles are removed from the top surface Wf and the rear surface Wb of the substrate W, and are discharged to outside the substrate (Step S4).

Meanwhile, at the frozen film removal processing, it is preferable that the blocking member 9 rotates as the substrate W rotates. The liquid component adhering to the blocking member 9 is therefore shaken off, and it is possible to prevent the mist-like liquid from intruding from around the substrate into the space formed between the blocking member 9 and the top surface Wf of the substrate W. Thus, in this embodiment, the rinsing liquid supplier 62, the rinsing liquid supply pipe 96, the rinsing liquid discharging nozzle 97, the liquid supply pipe 25 and the liquid discharging nozzle 27 correspond to the "remover" of the invention.

When the frozen film removal processing is thus finished, the determination is made whether the cleaning processing of the substrate W, namely liquid film forming processing, liquid film freezing processing, and frozen film removal processing, is completed or not (Step S5). When it is determined that the processing is completed (YES at Step S5), drying processing of the substrate W is carried out (Step S6). On the other hand, when it is determined that the processing is not completed (NO at Step S5), the routine is returned to Step S2 and cooled DIW is supplied to form the liquid film, and Steps S2 through S4 are executed repeatedly hereinafter. To be more specific, depending on the surface condition of the top surface Wf and the rear surface Wb of the substrate W which is a surface-to-be-processed or the diameter of particles and the type of particles which are to be removed, the particles may not be removed sufficiently off from the top surface Wf and the rear surface Wb of the substrate W through one cleaning. In such a case, the determination is made that the processing is not completed. Through repeated execution of liquid film forming processing, liquid film freezing processing, and frozen film removal processing over a predetermined number of times, the particles are removed off from the top surface Wf and the rear surface Wb of the substrate W. The number of re-executions may be determined in advance as a processing recipe, and the cleaning processing may be repeated over thus determined number of times according to a processing recipe which is chosen appropriately.

At Step S6, the control unit 4 increases the rotation speeds of the motors for the chuck rotating mechanism 22 and the blocking-member rotating mechanism 93 and makes the substrate W and the blocking member 9 rotate at high speeds to execute drying processing of the substrate W. During this drying processing, nitrogen gas is supplied from the drying gas supplier 65 via the gas supply pipes 95 and 29, to thereby make a nitrogen gas atmosphere in the space which is sandwiched between the blocking member 9 and the top surface Wf of the substrate W and the space which is sandwiched between the spin base 23 and the rear surface Wb of the substrate W. This facilitates drying of the substrate W and shortens the drying time. After the drying processing, the substrate W stops rotating and the processed substrate W is taken out from the processing chamber 1 (Step S7). Thus, in this embodiment, Step S2 corresponds to the "liquid film forming step" of the invention, and Step S3 corresponds to the "freezing step" of the invention.

As described above, according to this embodiment, since the DIW to be supplied to the top surface Wf and the rear surface Wb of the substrate W, for the purpose of forming the liquid films $11f$ and $11b$ on the top surface Wf and the rear surface Wb of the substrate W, is cooled to a temperature lower than room temperature by means of the temperature adjuster 623, it is possible to shorten the time required to form the frozen films $13f$ and $13b$. To be more specific, most of the time required to freeze the liquid film is spent on lowering the temperature of the liquid which composes the liquid film to near the freezing point, as described later. Consequently, in this embodiment, the DIW to be supplied to the substrate W is cooled beforehand. Therefore, the time required to reduce the temperature of the liquid films $11f$ and $11b$ to near the freezing point is shortened, thereby shortening the time required for freezing the liquid films. As a result, it is possible to shorten the time required for cleaning processing and to increase the throughput of substrate processing.

Further, according to this embodiment, removal of the frozen film $13f$ from the top surface Wf of the substrate W and removal of the frozen film $13b$ as well from the rear surface Wb of the substrate W are executed. Hence, it is possible to effectively remove the particles adhering to the top surface Wf and the rear surface Wb of the substrate W. This attains favorable cleaning of the whole of the top surface Wf and the rear surface Wb of the substrate W. Further, since the liquid film $11b$ of the side of the rear surface Wb is frozen at the same time that the liquid film $11f$ of the side of the top surface Wf is frozen, it is possible to clean the top surface Wf and the rear surface Wb of the substrate W without decreasing the throughput. That is, since it is possible to clean not only the top surface Wf of the substrate W but the rear surface Wb of the substrate W as well without reversing the substrate W or otherwise appropriate operation, it is possible to clean the top surface Wf and the rear surface Wb of the substrate W in approximately the same period of time as that required for cleaning of the top surface Wf of the substrate W.

Further, according to this embodiment, the cooling gas discharge nozzle 3 discharges, toward a local section of the top surface Wf of the substrate W, the cooling gas whose temperature is lower than the freezing point of the liquid which forms the liquid film $11f$ formed on the top surface Wf of the substrate W. The cooling gas discharge nozzle 3 then moves between the rotational center position Pc of the substrate W and the edge position Pe of the substrate W while the substrate W remain rotating, whereby the frozen film $13f$ is formed all over the top surface Wf of the substrate W. This limits a section receiving supply of the cooling gas to a very narrow area on the top surface Wf of the substrate W, which in turn minimizes a decrease of the temperatures of the substrate peripheral members such as the spin chuck 2. It is therefore possible to form the frozen film $13f$ all over the top surface Wf of the substrate W while suppressing deterioration of the substrate peripheral members. As a result, even when the substrate peripheral members are made of a chemical-resistant resin material with which it is hard to secure the resistance against cold energy, degradation of the material of the substrate peripheral members due to cold energy can be suppressed.

Further, according to this embodiment, it is possible to repeatedly perform the liquid film forming processing, the liquid film freezing processing and the frozen film removal processing inside the same processing chamber 1 for the predetermined times. It is therefore possible to securely remove off from the top surface Wf of the substrate W those particles which can not be removed from the top surface Wf of the substrate W through only single execution of the liquid film freezing processing and the frozen film removal processing.

Further, according to this embodiment, execution of the frozen film removal processing is started before the frozen film has been melted. This makes it possible to prevent particles fallen off from the top surface Wf of the substrate W at the liquid film freezing processing from re-adhering to the top surface Wf of the substrate W again as the frozen film gets melted. It is therefore possible to efficiently remove the particles together with the frozen film off from the top surface Wf of the substrate W through execution of the frozen film removal processing, which is advantageous in improving the particle removal rate.

In other words, this embodiment comprises a liquid film forming unit which supplies a cooled liquid to a substrate to form a liquid film on the substrate, and a freezing unit which freezes the liquid film on the substrate.

Further, this embodiment comprises a liquid film forming step of supplying a cooled liquid to a substrate to form a liquid film on the substrate, and a freezing step of freezing the liquid film on the substrate.

Therefore, according to this embodiment, cooled liquid is supplied to a substrate to form a liquid film on the substrate, and the liquid film on the substrate is subsequently frozen. Incidentally, various experiments performed by the inventors revealed that most of the time required to freeze the liquid film is spent on reducing the temperature of the liquid which composes the liquid film to near the freezing point. In light of this, in this embodiment, the liquid supplied to the substrate is cooled down. Because of this, the time required to reduce the temperature of the liquid film to near the freezing point is shortened. Therefore, it is possible to shorten the time required to freeze the liquid film, thereby improving the throughput of the substrate processing. Meanwhile, the liquid supplied to the substrate may be cooled down to a temperature lower than room temperature for instance.

Further, in this embodiment, the freezing unit includes a cooling gas discharger which discharges a cooling gas whose temperature is lower than the freezing point of a liquid which composes the liquid film toward a local section of a surface of the substrate, and a relative moving mechanism which relatively moves the cooling gas discharger relative to the substrate and parallel to the substrate surface, and the relative moving mechanism relatively moves the cooling gas discharger relative to the substrate while the cooling gas discharger discharges the cooling gas, to thereby freeze the liquid film.

Therefore, according to this embodiment, a cooling gas whose temperature is lower than the freezing point of a liquid which composes the liquid film formed on the substrate is discharged from the cooling gas discharger toward a local section of a surface of the substrate. Then, the relative moving mechanism relatively moves the cooling gas discharger relative to the substrate and parallel to the substrate surface while the cooling gas discharger discharges the cooling gas, whereby the liquid film is frozen. To be more specific, the region the liquid film has frozen of the liquid film formed on the substrate expand with the relative movement, so that the frozen film is formed on the entire surface of the substrate. As described above, since the supplied area of the cooling gas is limited to a part of the substrate surface, temperature decline of members disposed around the substrate such as members for holding the substrate for example can be limited to a necessity minimum. Therefore, it is possible to suppress deterioration of these members.

Further, in this embodiment, the liquid film forming unit includes a temperature adjuster which adjusts a temperature of the liquid supplied to the substrate to a temperature lower than room temperature. According to this embodiment, since the temperature of the liquid which composes the liquid film is adjusted to a temperature lower than room temperature, the time period required for freezing the liquid film can be shortened accordingly. At this stage, the liquid is pure water or deionized water, and the temperature adjuster is arranged to cool the liquid to 0 through 10 degrees centigrade. Therefore, it is desirable because the liquid is not frozen since the temperature is not less than 0 degrees centigrade, and the time required for freezing can be preferably shortened since the temperature is not more than 10 degrees centigrade.

Further, this embodiment further includes a remover which removes the liquid film frozen by the freezing unit from the substrate. Therefore, even in the case where particles adhere to the substrate for instance, it is possible to effectively remove the particles from the substrate. Specifically, the volume of the liquid film is expanded by freezing the liquid film formed on the substrate, and the pressure generated by the volume expansion acts on the particles, whereby the adherence between the particles and the substrate is reduced or the particles are separated from the substrate. Hence, it is possible to easily remove the particles from the substrate by removing the frozen liquid film from the substrate.

Second Embodiment

Figure 7:
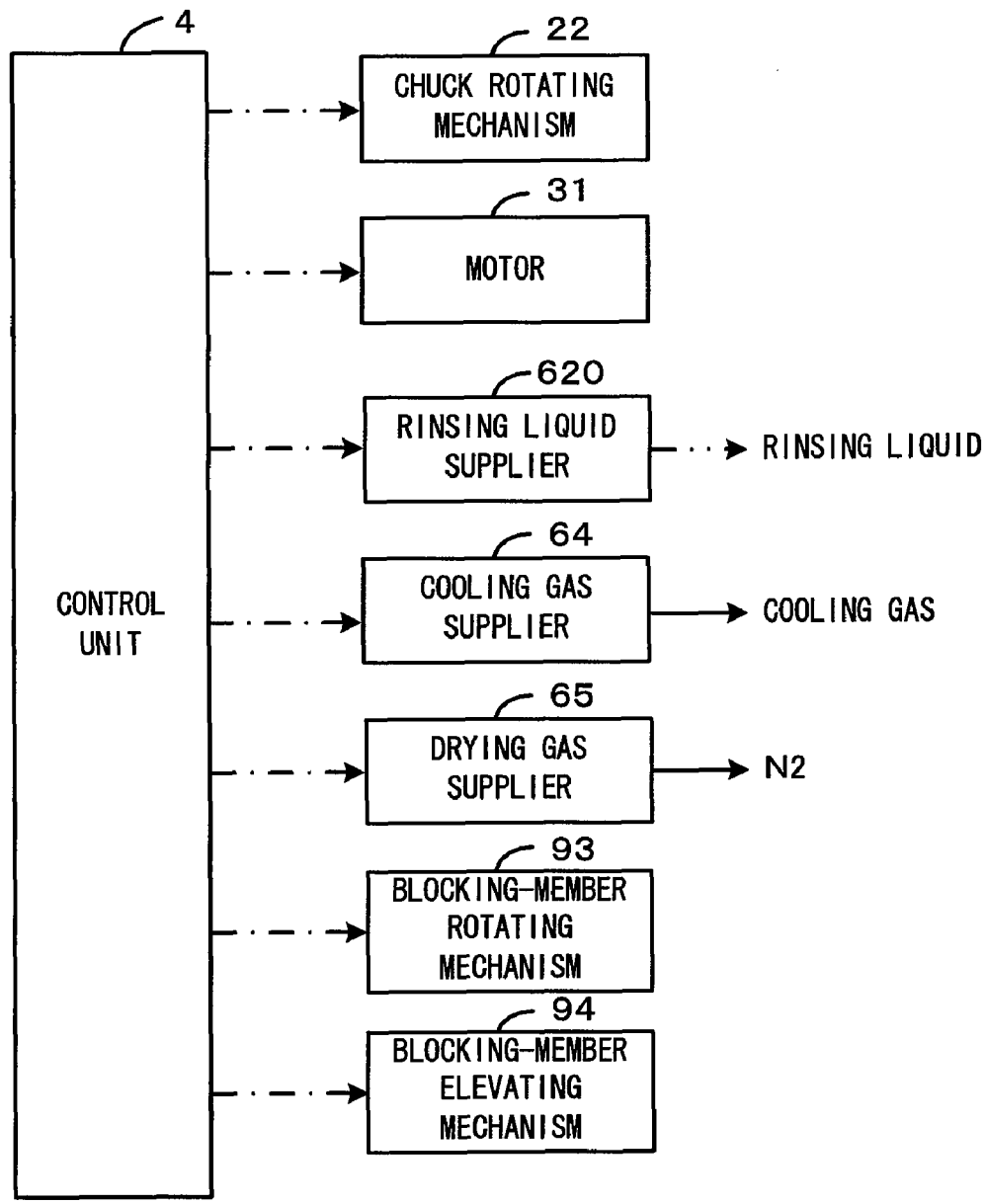
FIG. 7 is a block diagram showing a control construction in a second embodiment of a substrate processing apparatus according to the invention.
Figure 8:
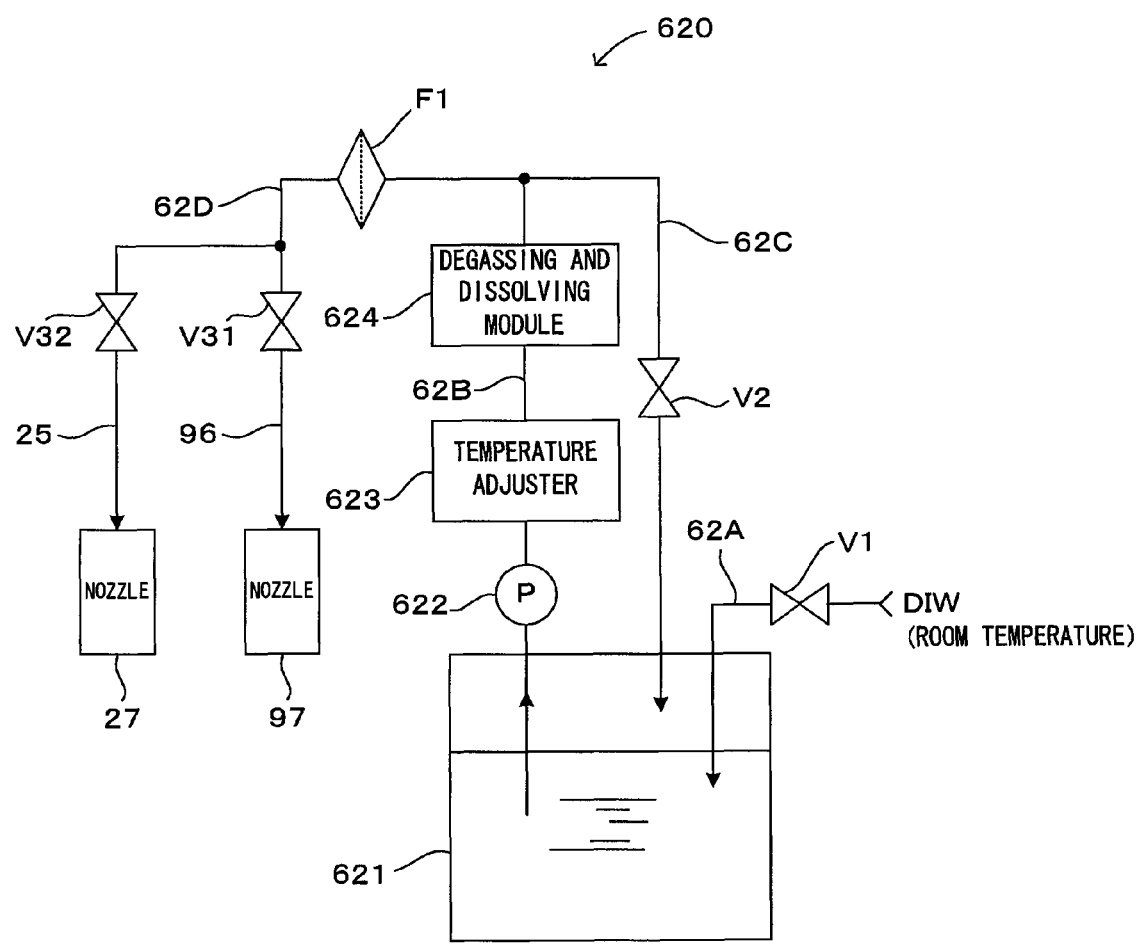
FIG. 8 is a view showing a frame format of a construction of a rinsing liquid supplier of the second embodiment.
Figure 9:
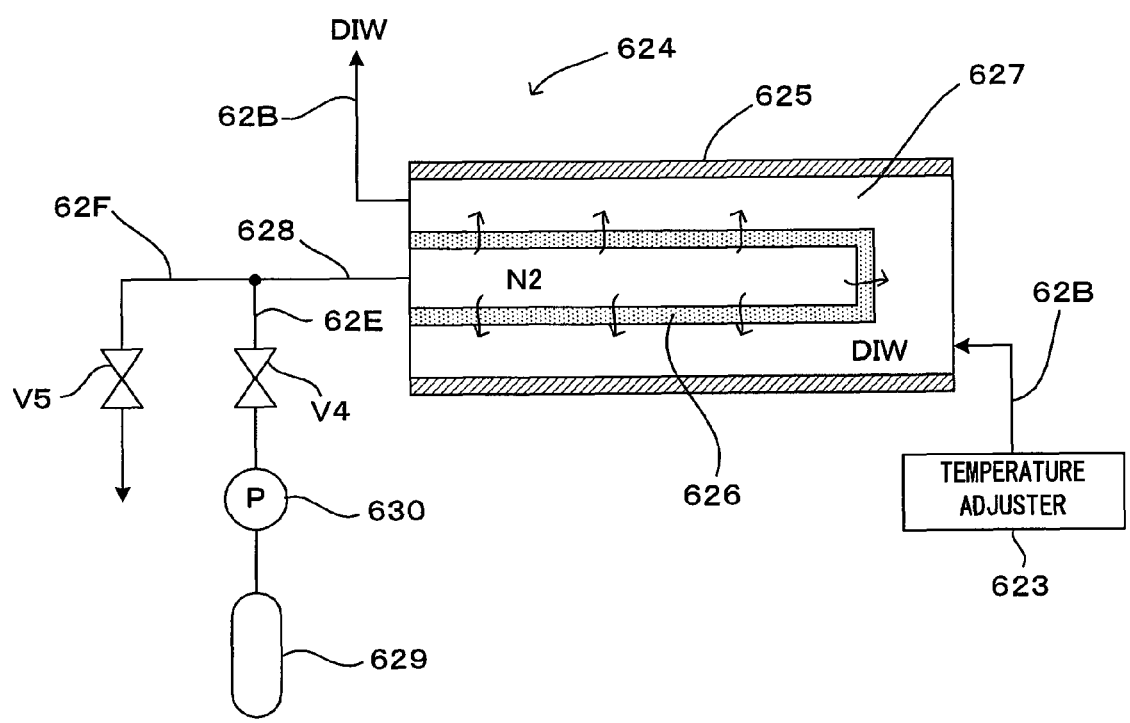
FIG. 9 is a view showing a frame format of a construction of a degassing and dissolving module.

FIG. 7 is a block diagram showing a control construction in a second embodiment of a substrate processing apparatus according to the invention, FIG. 8 is a view showing a frame format of a construction of a rinsing liquid supplier of the second embodiment, and FIG. 9 is a view showing a frame format of a construction of a degassing and dissolving module. The second embodiment differs significantly from the first embodiment in that the frozen film is formed only on the top surface Wf of the substrate W, and that a rinsing liquid supplier 620 is provided instead of the rinsing liquid supplier 62. Meanwhile, the structure of the processing chamber in the second embodiment is the same as the processing chamber 1 shown in FIG. 1, and the same reference characters are hereinafter used for the parts identical to those in the first embodiment. Further, the operation of the second embodiment is performed in the manner identical to the first embodiment except that the frozen film is formed only on the top surface Wf of the substrate W.

The rinsing liquid supplier 620 of the second embodiment differs from the rinsing liquid supplier 62 of the first embodiment in that a valve V31 and a valve V32 are disposed in the rinsing liquid supply pipe 96 and the liquid supply pipe 25 respectively instead of the valve V3, and that a degassing and dissolving module 624 is disposed in the supply pipe 62B. Since the valve V31 and the valve V32 are disposed in the rinsing liquid supply pipe 96 and the liquid supply pipe 25 respectively, it is possible to supply DIW only to the rinsing liquid discharging nozzle 97 upon forming the liquid film.

The degassing and dissolving module 624 adjusts the amount of gas dissolved in the DIW and has a double-pipe structure. To be more specific, a hollow pipe 626 which is cylindrical for instance is disposed inside a hollow pipe 625 which is cylindrical for instance. The pipe 626 is made of a material which allows only gas molecule to pass through and prevents liquid from passing through. And, a flow passage 627 formed between the inner circumference surface of the pipe 625 and the outer circumference surface of the pipe 626 is connected with the supply pipe 62B. Further, one end of a flow passage 628 formed inside the pipe 626 is closed, while the other end thereof branches out to be connected with supply pipes 62E and 62F, respectively. The leading end of the supply pipe 62E is connected with a tank 629, and a pump 630 and a valve V4 are disposed between the tank 629 and a branching point. Nitrogen gas is stored in the tank 629 for instance in this embodiment. Further, a valve V5 is disposed in the supply pipe 62F, of which the leading end is opened to the outside atmosphere to serve as a drainpipe.

And, when the pump 630 is activated in accordance with an operation command from the control unit 4 with the valve V4 opened and the valve V5 closed, the pressure inside the flow passage 628 increases. This causes the nitrogen gas inside the flow passage 628 to outflow to the flow passage 627 through the pipe 626 to increase the amount of nitrogen gas dissolved in the DIW. On the other hand, when the operation of the pump 630 is stopped in accordance with the operation command from the control unit 4 with the valve V5 opened and the valve V4 closed, the pressure inside the flow passage 628 decreases. This causes the nitrogen gas in the DIW to flow back to the flow passage 628 through the pipe 626 to reduce the amount of nitrogen gas dissolved in the DIW. In this embodiment, the degassing and dissolving module 624 is thus equivalent to a "dissolution amount adjuster" of this invention.

As described above, according to this embodiment, since the dissolution amount of the nitrogen gas dissolved in the DIW which composes the liquid film 11$f$ is adjusted by means of the degassing and dissolving module 624, it is possible to adjust the volume increase rate when the liquid film 11$f$ is frozen. To be more specific, it is known that the volume increase rate when a liquid is frozen positively correlates with the dissolution amount of gas dissolved in the liquid. And, when the volume increase rate increases and decreases, the pressure which is generated by the volume increase and which acts on particles increases and decreases, accordingly. As a result, particle removal rate increases and decreases and so does a possibility of damages on the substrate W. Therefore, according to this embodiment, it is possible to adjust the particle removal rate and the possibility of damage to be inflicted upon the substrate W, by adjusting the dissolution amount of nitrogen gas in the DIW by means of the degassing and dissolving module 624. To be more specific, when the priority is on the removal of particles in accordance with the kind of substrate processing most recently executed to the substrate W, the diameter and the kind of particles, or the like, it is possible to increase the particle removal rate by increasing the amount of nitrogen gas dissolved in the DIW by means of the degassing and dissolving module 624. On the other hand, when the priority is on preventing the occurrence of damages on the substrate W, the amount of nitrogen gas dissolved in the DIW may be reduced by means of the degassing and dissolving module 624.

Figure 10:
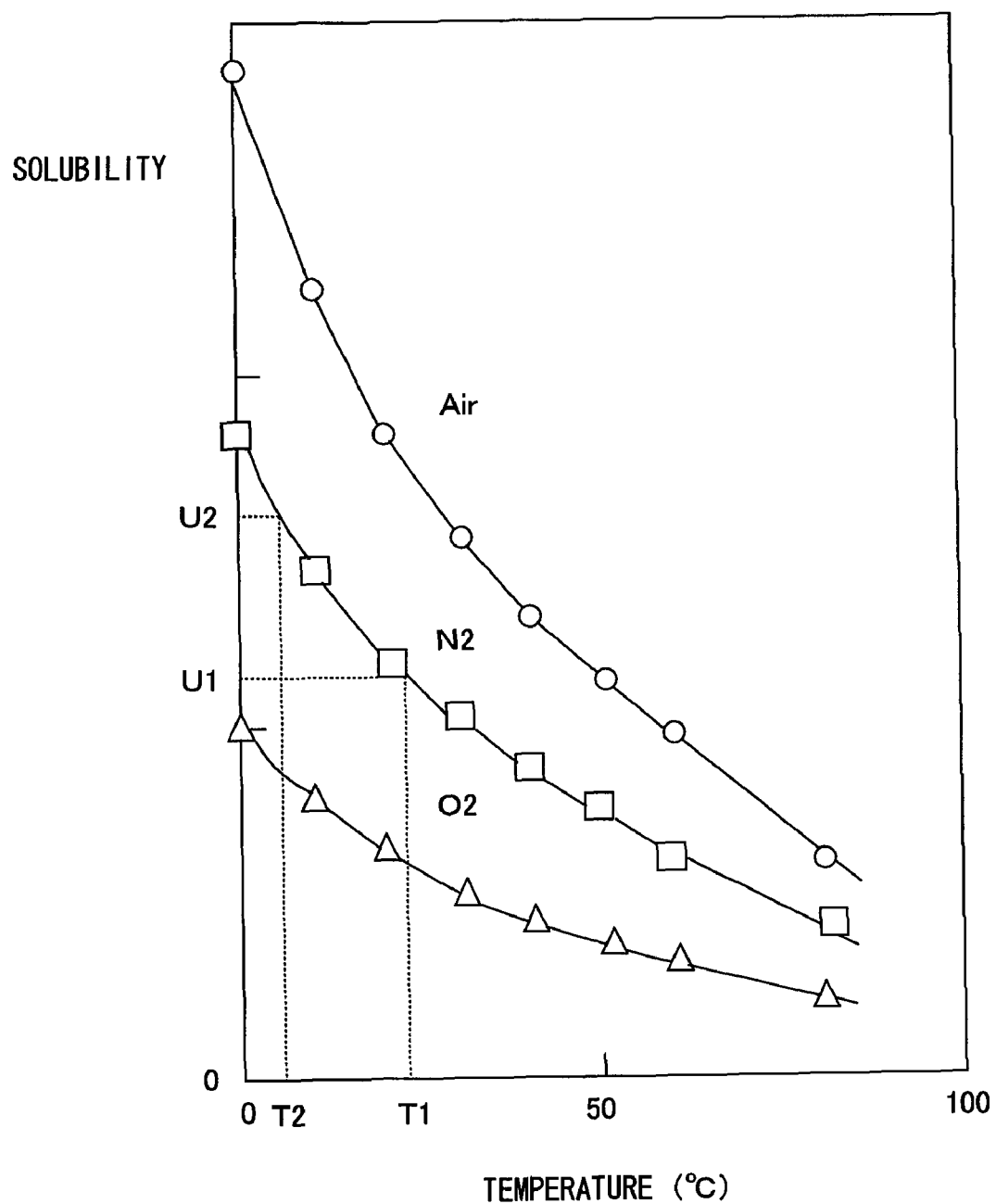
FIG. 10 is a graph showing relations between a temperature and solubility of air, oxygen and nitrogen in pure water.

Further, according to this embodiment, since the DIW is cooled to a temperature below room temperature by means of the temperature adjuster 623, it is possible to increase an adjustment range of the above volume increase rate when the liquid film 11$f$ is frozen. That is, it is known that the solubility of gas dissolved in a liquid increases as a temperature of the liquid decreases as shown in FIG. 10. FIG. 10 is a graph showing relations between a temperature and solubility of air, oxygen and nitrogen in pure water. Assuming that the case with DIW is almost similar to the case with pure water, the dissolution amount U can be adjusted within the range of $0 \leq U \leq U1$ when DIW is at room temperature T1. On the other hand, when DIW is cooled to a temperature T2 which is below room temperature T1 as in this embodiment, the dissolution amount U can be adjusted within the range of $0 \leq U \leq U2$. In other words, U1<U2, and the adjustment range of the dissolution amount U increases. As a result, the adjustment range of the volume increase rate when the liquid film 11$f$ is frozen also increases. Therefore, according to this embodiment, it has an advantage that, upon adjusting the particle removal rate and the possibility of damages on the substrate W, the adjustment range can be increased.

In other words, in this embodiment, the liquid film forming unit further includes a dissolution amount adjuster which adjusts dissolution amount of gas in the liquid supplied to the substrate. Therefore, since dissolution amount of gas in the liquid which composes the liquid film is adjusted, it becomes possible to control the particle removal rate. Specifically, when the dissolution amount of gas in the liquid which composes the liquid film increases and decreases, the degree of the volume expansion upon freezing the liquid film increases and decreases, accordingly. Hence, the pressure which is generated by the volume expansion and which acts on the particles increases and decreases. As a result, it becomes possible to control the particle removal rate. Meanwhile, the solubility of gas increases as a temperature of the liquid decreases in general. Therefore, it is desirable to adjust the amount of gas dissolved in the liquid by means of the dissolution amount adjuster in a condition that the liquid is cooled since the adjustment range is increased.

<Others>

Figure 11A:
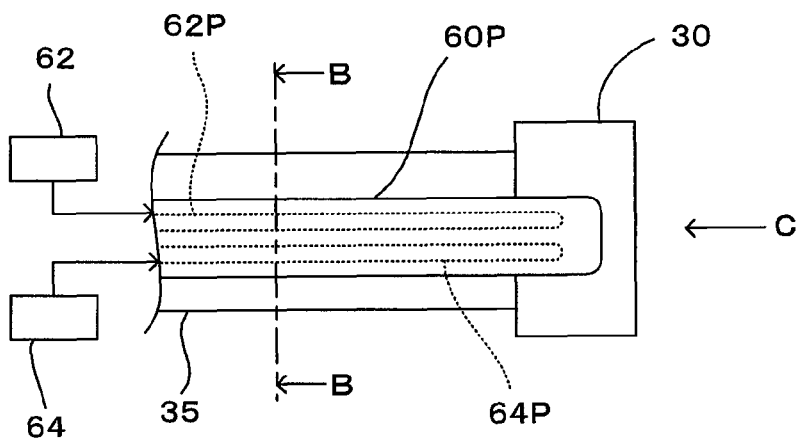
FIGS. 11A to 11C are diagrams showing a modification of discharge of the rinsing liquid, FIG. 11A being a plan view, FIG. 11B being a cross sectional view taken along the line B-B in FIG. 11A, and FIG. 11C being a side view taken in the direction of the arrow C in FIG. 11A.
Figure 11B:
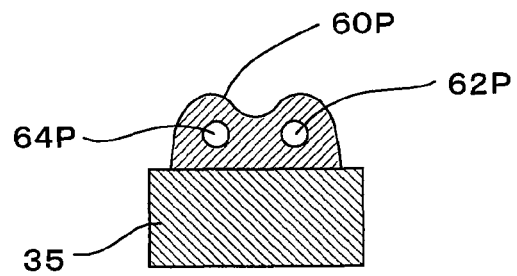
Figure 11C:
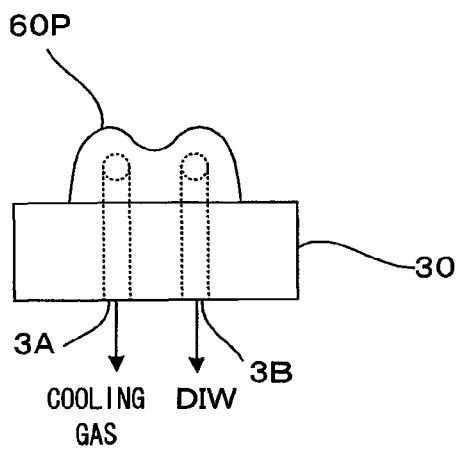

The invention is not limited to the embodiments described above but may be modified in various manners in addition to the embodiments above, to the extent not deviating from the object of the invention. In the first and the second embodiments described above for example, although the liquid film 11$f$ is formed on the top surface Wf of the substrate W with the DIW which is discharged from the rinsing liquid discharging nozzle 97 which is disposed at the under surface of the blocking member 9, this is not limiting. FIGS. 11A to 11C are diagrams showing a modification of discharge of the rinsing liquid, FIG. 11A being a plan view, FIG. 11B being a cross sectional view taken along the line B-B in FIG. 11A, and FIG. 11C being a side view taken in the direction of the arrow C in FIG. 11A.

According to this modification shown in FIGS. 11A to 11C, a discharge part 30 is disposed at the tip of the arm 35, and a supply tube 60P is installed on the top surface extending from the arm 35 to the discharge part 30. Disposed inside the supply tube 60P are a liquid supply pipe 62P which is communicated with the rinsing liquid supplier 62 and a gas supply pipe 64P which is communicated with the cooling gas supplier 64. In other words, the liquid supply pipe 62P and the gas supply pipe 64P are disposed side by side in the vicinity of each other. The cooling gas is discharged at a gas discharge outlet 3A which is formed in the discharge part 30 and is communicated with the gas supply pipe 64P, whereas the DIW is discharged at a liquid discharge outlet 3B which is formed near the gas discharge outlet 3A of the cooling gas discharge nozzle 3 and is communicated with the liquid supply pipe 62P.

Since the liquid supply pipe 62P carrying the DIW is disposed in the vicinity of the gas supply pipe 64P which carries the cooling gas which is at such an extremely low temperature as −100 degrees centigrade for example, this modification has an advantage that the cold energy of the cooling gas works to prevent the temperature of DIW which has been cooled down to a lower temperature than room temperature by the temperature adjuster 623 from rising. Further, according to this modification, since the liquid discharge outlet 3B for discharging the DIW is disposed in the vicinity of the gas discharge outlet 3A for discharging the cooling gas, it is possible to enhance the cooling effect exerted upon the DIW by the cooling gas. In this modification, the gas discharge outlet 3A thus corresponds to the "cooling gas discharger" of the invention and the liquid discharge outlet 3B thus corresponds to the "liquid discharge nozzle" of the invention.

In other words, in this modification, the liquid film forming unit includes a liquid supply pipe which supplies the cooled liquid, and a liquid discharge nozzle which discharges the liquid inside the liquid supply pipe toward the substrate, the freezing unit further includes a gas supply pipe which guides the cooling gas to the cooling gas discharger, and at least a part of the liquid supply pipe and at least a part of the gas supply pipe are disposed side by side in the vicinity of each other.

Therefore, according to this modification, since at least a part of the liquid supply pipe which supplies the cooled liquid and at least a part of the gas supply pipe which supplies the cooling gas are disposed side by side in the vicinity of each other, the liquid supplied to the substrate passes in the vicinity of the cooling gas whose temperature is lower than the freezing point of the liquid. Therefore, since the liquid to be supplied to the substrate is kept cooled, it is possible to more securely shorten the freezing time of the liquid film. At this stage, in the case where the temperature of the cooling gas is extremely low, about −100 degrees centigrade for instance, the cooling effect on the liquid passing nearby will be excellent.

Further, in this modification, the relative moving mechanism relatively moves the liquid discharge nozzle and the cooling gas discharger as one unit relative to the substrate. Therefore, the distance between the liquid discharge nozzle and the cooling gas discharger is always maintained constant. Hence, when the cooling gas is discharged from the cooling gas discharger, the liquid discharge nozzle is cooled by the cold air from the cooling gas. Therefore, this modification has an advantage that the cooling of the liquid to be supplied to the substrate is accelerated.

Figure 12:
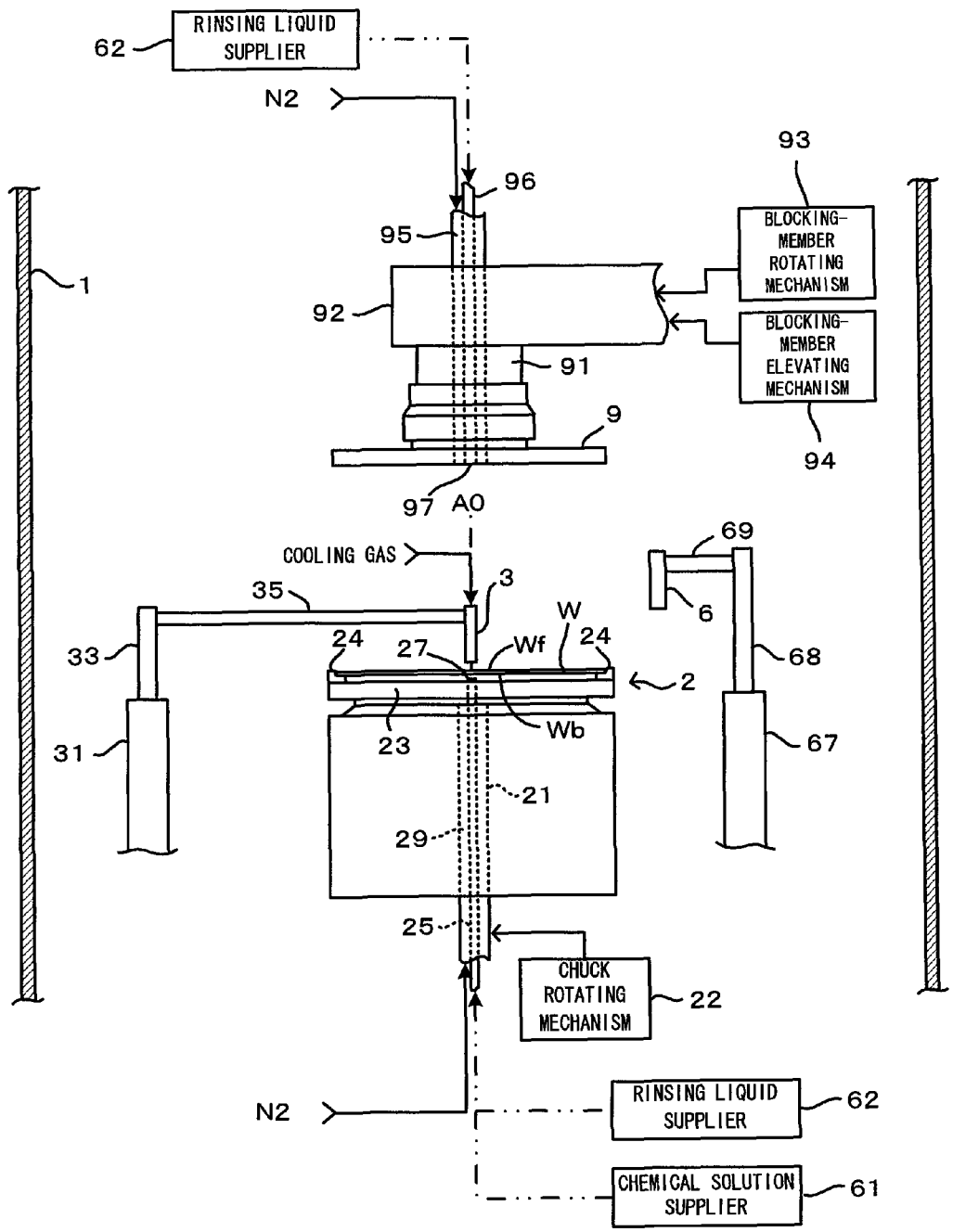
FIG. 12 is a diagram showing a modification of the first embodiment.

Further, in the first embodiment described above, although the frozen films 13f and 13b formed on the top surface Wf and the rear surface Wb of the substrate W are removed by the DIW supplied from the rinsing liquid supplier 62, the invention is not limited to this. The frozen films may be removed through chemical cleaning. FIG. 12 is a diagram showing a modification of the first embodiment. FIG. 13 is a diagram showing a frozen film removal processing in the apparatus shown in FIG. 12. In this modification, the liquid supply pipe 25 is connected also to a chemical solution supplier 61 in addition to the rinsing liquid supplier 62. The chemical solution supplier 61 supplies a chemical solution such as an SC1 solution (a liquid mixture of aqueous ammonia and a hydrogen peroxide solution). The apparatus is structured so that either one of the chemical solution or DIW is selectively supplied to the liquid discharging nozzle 27 via the liquid supply pipe 25.

A motor 67 is disposed at a place outward from the spin chuck 2 in a circumferential direction. A rotary shaft 68 is connected to the motor 67, an arm 69 extending horizontally is connected to the rotary shaft 68, and a chemical solution discharge nozzle 6 is attached to the end of the arm 69. When the motor 67 is driven in accordance with an operation command from the control unit 4, the chemical solution discharge nozzle 6 moves in reciprocation between a discharging position above the rotation center A0 of the substrate W and a stand-by position away sideward from the discharging position. The chemical solution discharge nozzle 6 is connected to the chemical solution supplier 61 and discharges the chemical solution supplied from the chemical solution supplier 61 toward the top surface Wf of the substrate W which is held by the spin chuck 2.

In this modification, after freezing of the liquid film, the control unit 4 positions the chemical solution discharge nozzle 6 at the discharging position and the SC1 solution is pressure fed into the chemical solution discharge nozzle 6 and is supplied to the liquid discharging nozzle 27. This causes the SC1 solution to be supplied from the chemical solution discharge nozzle 6 to the top surface Wf of the substrate W and from the liquid discharging nozzle 27 to the rear surface Wb of the substrate W. Since the zeta potential (electrokinetic potential) at the surface of the solid matter in the SC1 solution has a relatively large value, when the area between the particles on the top surface Wf of the substrate W and the top surface Wf of the substrate W and the area between the particles on the rear surface Wb of the substrate W and the rear surface Wb of the substrate W are filled with the SC1 solution respectively, significant repulsive forces act between the particles and the top surface Wf of the substrate W and between the particles and the rear surface W of the substrate W respectively. This makes it even easier for the particles to fall off from the top surface Wf and the rear surface Wb of the substrate W and achieves effective removal of the particles from the top surface Wf and the rear surface Wb of the substrate W. Further, in this modification, after cleaning with the SC1 solution, the DIW is supplied to the top surface Wf and the rear surface Wb of the substrate W and rinsing with the DIW is performed. Thus, in this modification, the chemical solution supplier 61 and the chemical solution discharge nozzle 6 function as the "remover" of the invention.

Meanwhile, in this modification, the cleaning with the SC1 solution as chemical cleaning which principally exerts a chemical cleaning effect upon a top surface Wf of the substrate W is executed. However, the chemical cleaning is not limited to the cleaning with the SC1 solution. For example, the chemical cleaning may be wet cleaning which uses, as a processing liquid, an alkaline solution, an acidic solution, an organic solvent, a surface active surfactant or the like other than the SC1 solution or wet cleaning which uses a proper combination of these as a processing liquid.

Meanwhile, DIW at room temperature is discharged from the liquid discharging nozzle 27 which serves as the "remover" of this invention by stopping the operation of the temperature adjuster 623 in the first embodiment described above. However, a supply mechanism for supplying DIW at room temperature to the substrate as the "remover" may be provided differently. For instance, a frozen film may be removed by discharging DIW at room temperature from a supply mechanism which is similar to the chemical solution supplier 61 and the chemical solution discharge nozzle 6.

Figure 14:
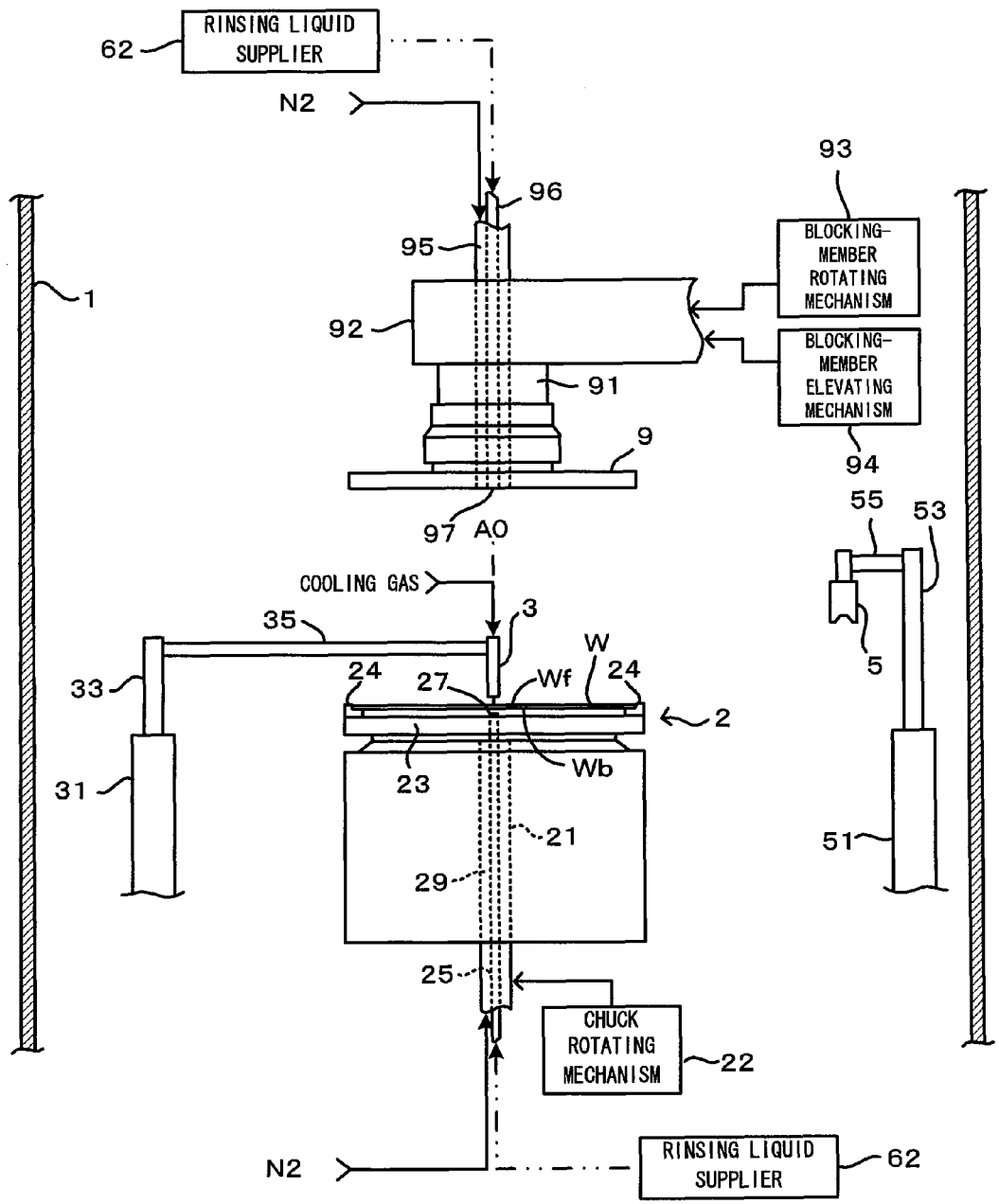
FIG. 14 is a diagram showing a modification of the first embodiment.

Further, in the first embodiment described above, although the frozen film 13f formed on the top surface Wf of the substrate W is removed by the DIW supplied from the rinsing liquid supplier 62, the invention is not limited to this. The frozen film may be removed through physical cleaning. FIG. 14 is a diagram showing a modification of the first embodiment. FIG. 15 is a diagram showing a structure of a two-fluid nozzle.

A motor 51 is disposed at a place outward from the spin chuck 2 in a circumferential direction. A rotary shaft 53 is connected to the motor 51, an arm 55 extending horizontally is connected to the rotary shaft 53, and a two-fluid nozzle 5 is attached to the end of the arm 55. When the motor 51 is driven in accordance with an operation command from the control unit 4, the two-fluid nozzle 5 swings around the rotary shaft 53.

This two-fluid nozzle 5 is a two-fluid nozzle of the so-called external mixing type which collides a processing liquid and a nitrogen gas (N2) in air (outside the nozzle) and generates droplets of the processing liquid. In this modification for instance, DIW supplied from the rinsing liquid supplier 62 is used as the processing liquid, and the nitrogen gas supplied from the drying gas supplier 65 is used. The two-fluid nozzle 5 includes a hollow body section 501. A processing liquid discharge nozzle 502, which has a processing liquid discharging outlet 521 inside the body section 501, is inserted in the two-fluid nozzle 5. The processing liquid discharging outlet 521 is disposed at a top surface part 512 of an umbrella part 511 of the two-fluid nozzle 5. Hence, supplied to the processing liquid discharge nozzle 502, the processing liquid is discharged toward the substrate W from the processing liquid discharging outlet 521.

Further, a gas discharge nozzle 503 is disposed in the vicinity of the processing liquid discharge nozzle 502, defining a ring-shaped gas channel which surrounds the processing liquid discharge nozzle 502. The tip end of the gas discharge nozzle 503 is tapered progressively thin, and the opening of this nozzle is opposed against the surface of the substrate W. Hence, supplied to the gas discharge nozzle 503, the nitrogen gas is discharged toward the substrate W from the gas discharging outlet 531 of the gas discharge nozzle 503.

The track of thus discharged nitrogen gas intersects that of the DIW discharged from the processing liquid discharging outlet 521. That is, the liquid flow from the processing liquid discharging outlet 521 collides with the gas flow at a collision section G which is located within a mixing region. The gas flow is discharged so as to converge at the collision section G.

The mixing region is a space at the bottom end of the body section 501. Hence, the nitrogen gas colliding the DIW quickly changes the DIW into droplets, immediately near the discharging direction in which the DIW is discharged from the processing liquid discharging outlet 521. Cleaning droplets are generated in this manner.

Then, after freezing of the liquid film, the control unit 4, with the blocking member 9 located at the separated position, makes the two-fluid nozzle 5 supply DIW droplets to the top surface Wf of the substrate W while making the two-fluid nozzle 5 pivot over the substrate W. This collides droplets with particles adhering to the top surface Wf of the substrate W, and due to the kinetic energy of the droplets, the particles are physically removed. This makes it easy to remove particles off from the top surface Wf of the substrate W and realizes excellent cleaning of the top surface Wf of the substrate W. Thus, in this modification, the rinsing liquid supplier 62, the drying gas supplier 65 and the two-fluid nozzle 5 function as the "remover" of the invention.

Meanwhile, in this modification, although the physical cleaning with droplets using the two-fluid nozzle of the so-called external mixing type is executed, this is not limiting. A two-fluid nozzle of the so-called internal mixing type may be used to execute the droplets cleaning. That is, a processing liquid and gas may be mixed inside the two-fluid nozzle to generate cleaning droplets, and the droplets may be discharged toward the substrate W at a discharging outlet of the nozzle.

Further, in this modification, the cleaning with droplets using the two-fluid nozzle as physical cleaning which principally exerts a physical effect upon the surface Wf of the substrate W is executed. However, the physical cleaning is not limited to the droplets cleaning. The physical cleaning may for example be scrub cleaning which cleans the substrate W with a brush, a sponge or the like brought into contact with the surface Wf of the substrate W, ultrasonic cleaning which cleans the substrate W by vibrating and separating particles adhering to the surface Wf of the substrate W utilizing ultrasonic vibrations or by means of an action upon the surface Wf of the substrate W by cavitations, air bubbles or the like formed in a processing liquid, etc. Further alternatively, a frozen liquid film may be removed off from the surface Wf of the substrate W through cleaning of the surface Wf of the substrate W which combines depending upon necessity physical cleaning and chemical cleaning.

Further, in the embodiments above, although DIW is used as a rinsing liquid which forms a liquid film, the rinsing liquid is not limited to DIW. For instance, purified water, carbonated water, a hydrogen-saturated water, and the like may be used as a rinsing liquid which forms a liquid film.

Further, although the embodiments above have described an example of applying the substrate processing apparatus which has a function to freeze a liquid film formed on the surface Wf of the substrate W according to the invention to cleaning processing to remove contaminants, such as particles, adhering to the surface Wf of the substrate W, the invention is not limited only to such an application. For instance, a liquid film frozen by using the substrate processing apparatus and method according to the invention is used as a protection film to protect the substrate surface. That is, a liquid film is formed on the top surface Wf of the substrate W, and the liquid film is frozen so that the frozen film function as a protection film of the top surface Wf of the substrate W, thereby protecting the top surface Wf of the substrate W against contamination from the ambient atmosphere around the substrate W. This allows the substrate W to be stored or remain on standby while preventing contamination of the top surface Wf of the substrate W by the frozen film acting as a protection film.

The present invention is applicable to a substrate processing apparatus and a substrate processing method which freezes a liquid film formed on a surface of substrates in general including semiconductor wafers, glass substrates for photomask, glass substrates for liquid crystal display, glass substrates for plasma display, substrates for FED (field emission display), substrates for optical disks, substrates for magnetic disks, substrates for magnet-optical disks, etc.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method, comprising:
a liquid film forming step of supplying a cooled liquid to a rotating substrate and spreading the cooled liquid on the surface of the substrate by centrifugal force due to the rotation of the substrate to form a liquid film on the substrate, the cooled liquid being pure water or deionized water and cooled down to a temperature of not more than 10 degrees centigrade while maintained at not less than 0 degrees centigrade; and
a freezing step of freezing the liquid film on the substrate, wherein in the freezing step, a cooling gas discharger discharges a cooling gas whose temperature is lower than 0 degrees centigrade onto a part of the liquid film to freeze a local section limited to said part of the liquid film; and the cooling gas discharger is moved while the substrate is rotated, to thereby expand the frozen local section and freeze the liquid film as a whole.

2. A substrate processing method, comprising the steps of:
supplying a cooled liquid to a rotating substrate to form a liquid film on the substrate, the cooled liquid being cooled down to a temperature not higher than room temperature; and
freezing the liquid film on the substrate;
wherein the freezing step includes:
discharging a cooling gas whose temperature is lower than the freezing point of a liquid which composes the liquid film, from a cooling gas discharger, onto a part of the liquid film to freeze a local section limited to said part of the liquid film;
rotating the substrate; and
moving the cooling gas discharger relative to the substrate and parallel to the substrate surface so as to move the local section of the liquid film along a generally radial path extending between a center portion and an edge portion of the substrate surface while rotating the substrate;
wherein, after the liquid film has been formed on the substrate, the cooling gas discharger is moved relative to the substrate while the cooling gas is being discharged, to thereby expand the frozen local section and freeze the liquid film as a whole.

3. The substrate processing method of claim 2, further comprising the step of adjusting a temperature of the liquid supplied to the substrate to a temperature lower than room temperature.

4. The substrate processing method of claim 3, wherein the liquid is pure water or deionized water, and the liquid is cooled down to a temperature of 0 to 10 degrees centigrade.

* * * * *